United States Patent
Shin et al.

(10) Patent No.: US 8,120,176 B2
(45) Date of Patent: Feb. 21, 2012

(54) SEMICONDUCTOR DEVICE HAVING A CONDUCTIVE BUMP

(75) Inventors: Dong-Kil Shin, Hwaseong-si (KR); Shle-Ge Lee, Seoul (KR); Jong-Joo Lee, Gyeonggi-do (KR); Jong-Ho Lee, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 188 days.

(21) Appl. No.: 12/722,794

(22) Filed: Mar. 12, 2010

(65) Prior Publication Data

US 2010/0230811 A1    Sep. 16, 2010

(30) Foreign Application Priority Data

Mar. 13, 2009    (KR) .................. 10-2009-0021719

(51) Int. Cl.
*H01L 23/48* (2006.01)

(52) U.S. Cl. .................. 257/737; 257/738; 257/778

(58) Field of Classification Search .................. 257/737, 257/738, 778

See application file for complete search history.

(56) References Cited

U.S. PATENT DOCUMENTS

| | | | |
|---|---|---|---|
| 6,400,021 B1 * | 6/2002 | Cho | 257/738 |
| 6,427,763 B1 | 8/2002 | Matsumoto | |
| 6,518,651 B2 * | 2/2003 | Hashimoto | 257/669 |
| 6,825,541 B2 * | 11/2004 | Huang et al. | 257/459 |
| 2006/0237842 A1 * | 10/2006 | Shindo | 257/737 |
| 2009/0309216 A1 * | 12/2009 | Jeon et al. | 257/737 |

FOREIGN PATENT DOCUMENTS

| | | |
|---|---|---|
| JP | 2001-351937 | 12/2001 |
| KR | 1020030016914 | 3/2003 |
| KR | 1020070058298 | 6/2007 |

* cited by examiner

*Primary Examiner* — Matthew Landau
*Assistant Examiner* — James Mitchell
(74) *Attorney, Agent, or Firm* — F. Chau & Associates, LLC

(57) ABSTRACT

In one embodiment, a semiconductor device includes a semiconductor substrate and a bonding pad disposed thereon. The semiconductor device also includes a passivation layer, a buffer layer, and an insulating layer sequentially stacked on the semiconductor substrate. According to one aspect, a first recess is defined within the passivation layer, the buffer layer, and the insulating layer to expose at least a region of the bonding pad and a second recess is defined within the insulating layer to expose at least a region of the buffer layer and spaced apart from the first recess such that a portion of the insulating layer is interposed therebetween. Further, the semiconductor device includes a conductive solder bump disposed within the first and second recesses. The conductive solder bump may be connected to the bonding pad in the first recess and supported by the buffer layer through a protrusion of the conductive solder bump extending into the second recess.

19 Claims, 23 Drawing Sheets

SEMICONDUCTOR DEVICE HAVING A CONDUCTIVE BUMP

CROSS-REFERENCE TO RELATED APPLICATION

This application claims the benefit of priority under 35 U.S.C. §119 from Korean Patent Application No. 10-2009-0021719, filed on Mar. 13, 2009, the contents of which are hereby incorporated herein by reference in its entirety.

BACKGROUND

1. Technical Field

The present disclosure generally relates to semiconductor fabrication and, more particularly, to a semiconductor device provided with a conductive bump for flip-chip bonding.

2. Description of Related Art

In flip-chip packaging technologies, also known as Controlled Collapse Chip Connection, solder bumps used for electrically connecting a printed circuit board (PCB) substrate with a semiconductor chip are known to be susceptible to damages. The damages can be caused by, for example, thermal stress occurring in the solder bump resulting from a difference of thermal expansion coefficients between the PCB substrate and the chip or external force applied to the solder bump during the bonding process. As a result, a crack may occur between the semiconductor chip and the solder bump, thereby resulting in device failures.

SUMMARY

Example embodiments provide a semiconductor device that may prevent a device failure caused by a crack between the semiconductor device and a solder bump.

According to example embodiments, a semiconductor device includes: a semiconductor substrate including a semiconductor device disposed in an active region; a bonding pad disposed on one side of an upper portion of the semiconductor substrate and configured to function as an input/output (I/O) terminal of the semiconductor device; a passivation layer, a buffer layer, and an insulating layer sequentially stacked on the semiconductor substrate including the bonding pad; a first recess formed by recessing the passivation layer, the buffer layer, and the insulating layer to expose the bonding pad; a second recess formed by recessing the insulating layer to expose the buffer layer and spaced apart from the first recess such that the insulating layer is interposed therebetween; and a conductive solder bump formed by filling the first and second recesses with a metal material. Here, the conductive solder bump is connected to the bonding pad in the first recess and supported by the buffer layer using a stick in the second recess.

The semiconductor device may further include a metal barrier layer disposed on the first recess, the insulating layer configured to separate the second recess from the first recess and the second recess. The metal barrier layer may be formed of one selected from the group consisting of titanium (Ti), copper (Cu), and nickel (Ni). Thus, the bonding pad may be bonded to the solder bump in the first recess, and the buffer layer may be bonded to the stick in the second recess.

The semiconductor device may further include a metal barrier layer disposed on the first recess and the insulating layer configured to separate the second recess from the first recess. The metal barrier layer may be formed of one selected from the group consisting of titanium (Ti), copper (Cu), and nickel (Ni). Thus, the bonding pad may be bonded to the solder bump in the first recess, while the buffer layer may not be bonded to the stick in the second recess.

The area of the first recess may be about 20% to about 30% of the sectional area of the solder bump.

The buffer layer may include a photosensitive polyimide (PSPI) layer functioning as a photoresist pattern to reduce stress applied to the semiconductor device.

From the plan view, the first recess may have a block shape having a major axis and a minor axis that extend from the center thereof in perpendicular directions to each other. The major axis may be at least twice as long as the minor axis.

The second recess may be spaced apart from the first recess by the insulating layer and include at least one block formed in at least a region that deviates from an extension line of the major axis of the first recess.

The second recess may include a pair of blocks, and a straight line connecting the centers of the pair of blocks of the second recess may pass through the center of the first recess.

The straight line connecting the centers of the pair of blocks of the second recess may deviate from an extension line of the minor axis of the first recess.

The straight line connecting the centers of the pair of blocks of the second recess may be in the same direction as an external force applied to a side surface of the solder bump.

According to other example embodiments, a semiconductor device includes: a semiconductor substrate including a semiconductor device disposed in an active region; a bonding pad disposed on one side of an upper portion of the semiconductor substrate and configured to function as an input/output (I/O) terminal of the semiconductor device; a passivation layer, a buffer layer, and an insulating layer sequentially stacked on the semiconductor substrate including the bonding pad; a first recess formed by recessing the passivation layer, the buffer layer, and the insulating layer to expose the bonding pad; a second recess formed by recessing the buffer layer and the insulating layer to expose the buffer layer and spaced apart from the first recess such that the buffer layer and the insulating layer are interposed therebetween; and a conductive solder bump formed by filling the first and second recesses with a metal material. Here, the conductive solder bump is connected to the bonding pad in the first recess and supported by the passivation layer using a stick in the second recess.

According to still other example embodiments, a semiconductor device includes: a semiconductor substrate including a semiconductor device disposed in an active region; a bonding pad disposed on one side of an upper portion of the semiconductor substrate and configured to function as an input/output (I/O) terminal of the semiconductor device; a passivation layer, a buffer layer, and an insulating layer sequentially stacked on the semiconductor substrate including the bonding pad; a first recess formed by recessing the passivation layer, the buffer layer, and the insulating layer to expose the bonding pad; a second recess formed by recessing the insulating layer to expose the buffer layer in the vicinity of the first recess and integral with the first recess; and a conductive solder bump formed by filling the first and second recesses with a metal material. Here, the conductive solder bump is connected to the bonding pad in the first recess and supported by the buffer layer using a stick in the second recess.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Various example embodiments will now be described more fully with reference to the accompanying drawings in which some example embodiments are shown.

Example embodiments relate to a semiconductor device for a flip-chip bonding process of adhering the semiconductor device to a printed circuit board (PCB) substrate using a solder bump, and more particularly, to a semiconductor device including a solder bump with a stick, which substantially reduces an area of contact of the solder bump with a bonding pad and supports the solder bump like a prop outside the solder bump so that the solder bump may absorb an external force generated due to thermal mismatch or an external force applied thereto and disperses the external force into respective portions.

Also, example embodiments relate to a semiconductor device in which a passivation layer, a buffer layer, and an insulating layer are sequentially stacked on a bonding pad and partially removed to the entire depths thereof to form a first recess, and the insulating layer may be removed from the buffer layer outside the first recess to form a second recess so that a stick can be supported on the buffer layer formed of photosensitive polyimide (PSPI).

In addition, example embodiments relate to a semiconductor device in which a metal barrier layer formed of, for example, titanium (Ti), is deposited in a first recess to couple a bonding pad with a solder bump, while the metal barrier layer is not deposited in a second recess to prevent concentration of local stress due to the bonding of a buffer layer with a stick.

Furthermore, example embodiments relate to a semiconductor device in which a first recess includes a block with a major axis and a minor axis, a second recess includes a pair of blocks angled to deviate from an extension line of the major axis of the first recess, and a straight line connecting the centers of the pair of blocks of the second recess angled to deviate from an extension line of the minor axis of the first recess in the same direction as an external force.

Embodiment 1

Figure 1:
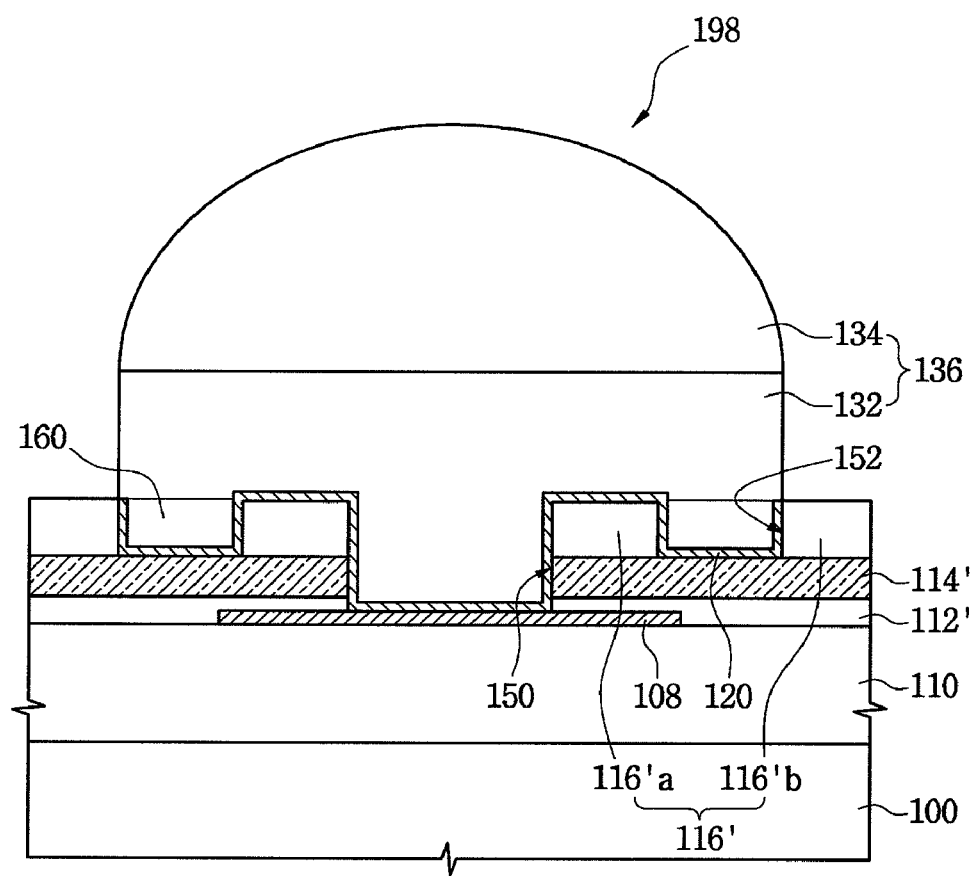
FIGS. 1 and 2 are cross-sectional and plan views of a semiconductor device having a bump with a stick or protrusion according to a first example embodiment, respectively.

FIG. 1 is a cross-sectional view of a semiconductor device 198 for a flip-chip bonding process according to a first example embodiment, which mainly illustrates a solder land region in which a conductive ball or conductive bump such as a solder bump 136 may be formed. Also, FIG. 2 is a plan view of the semiconductor device 198 of FIG. 1, in which the solder bump 136 and a metal barrier layer 120 are omitted to facilitate the understanding of a planar structure of the semiconductor device.

Figure 2:
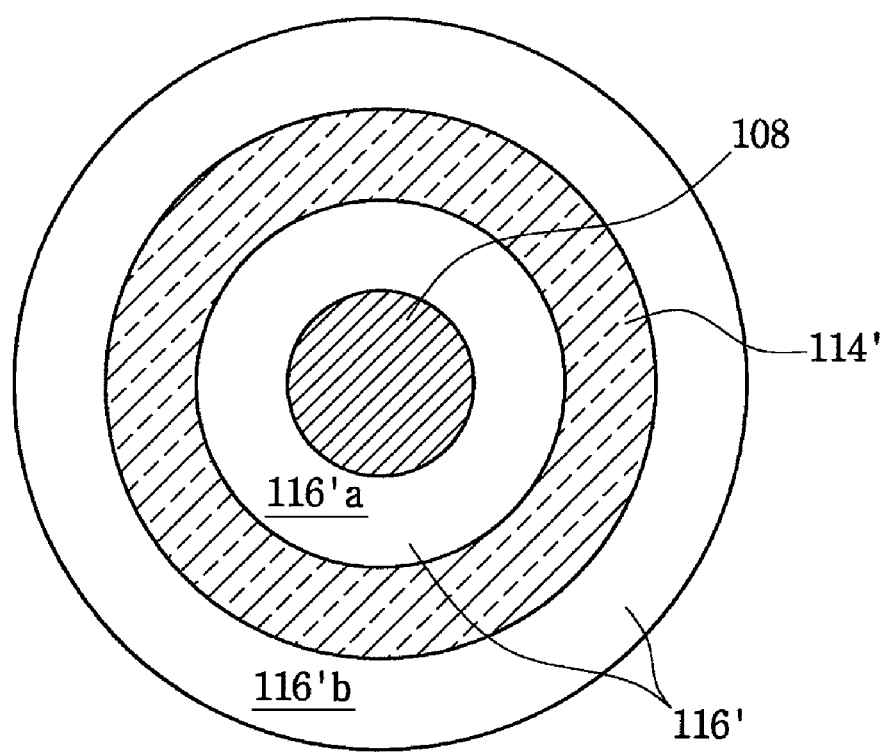

Referring to FIGS. 1 and 2, the semiconductor device 198 for the flip-chip bonding process may include a semiconductor substrate 100, a bonding pad 108 disposed on the semiconductor substrate 100, and the solder bump 136 used to electrically connect the semiconductor device 198 with a printed circuit board (PCB) (not shown). Also, a passivation layer 112', a buffer layer 114', and an insulating layer 116' may be sequentially stacked on the semiconductor substrate 100. The insulating layer 116', the buffer layer 114', and the passivation layer 112' may include a first recess 150 exposing at least a region of the bonding pad 108. Also, the insulating layer 116' may further include a second recess 152. The second recess 152 may include a stick or protrusion 160 disposed therein.

Although not shown, the semiconductor substrate 100 may include a plurality of semiconductor devices disposed in an active region. For example, a transistor may be formed in the active region defined by a device isolation layer. An interlayer insulating layer 110 may be stacked on a top surface of the semiconductor substrate 100 having transistors and other semiconductor devices. Thus, a via contact (not illustrated) may be formed in the interlayer insulating layer 110 to electrically connect the bonding pad 108 with the transistor.

The bonding pad 108 may be an input/output (I/O) terminal of the semiconductor device. The bonding pad 108 may be formed of a metal having a low resistivity, such as aluminum (Al) or copper (Cu).

The passivation layer 112' may be used to protect a top surface of the semiconductor substrate 100 from external contaminants. Thus, the passivation layer 112' may include a silicon nitride (SiN) layer.

The buffer layer 114' may be used to reduce stress applied to the semiconductor device. In this case, the buffer layer 114' may be an organic material such as a photosensitive polyimide (PSPI) layer functioning as a photoresist pattern.

The insulating layer 116' may have a redistribution layer (not shown) formed of a conductive material therein. The insulating layer 116' may be formed of, for example, a phenol resin or rubber particles.

The first recess 150 may be used to bond the solder bump 136 with the bonding pad 108. The first recess 150 may be formed by patterning the passivation layer 112', the buffer layer 114', and the insulating layer 116' to expose the bonding pad 108. Although the first recess 150 is formed in a circular block shape as shown in FIG. 2, example embodiments of the present inventive concept are not limited thereto. As will be described later, when a bonding pad appropriate for a small-sized semiconductor device, such as an FA-flip chip, is formed, the first recess 150 may have a rectangular block shape with a first side longer than a second side, as opposed to a circular shape or a nearly circular polygonal shape.

A ratio of the sectional area of the first recess 150 to that of the solder bump 136 may be controlled to be about 1:5 to about 1:2. In other words, the cross-sectional area of the first recess 150 may be about 50% or less of the cross-sectional area of the solder bump 136, more specifically, about 20 to about 30% of the sectional area of the solder bump 136. Even if the absolute area of the first recess 150 is reduced to achieve high integration density, the second recess 152 may increase the lifespan of the solder bump 136.

A metal barrier layer 120 may be stacked in and around the first recess 150. The metal barrier layer 120 may facilitate the bonding of the solder bump 136 with the bonding pad 108. Thus, the metal barrier layer 120 may extend from an inner surface of the first recess 150 to an inner surface of the second recess 152. In other words, in plan view, the metal barrier layer 120 may be provided in the form of a circle with a radius extending from the center of the first recess 150 to an edge of the second recess 152. The metal barrier layer 120 may be formed of titanium (Ti), copper (Cu), or nickel (Ni).

The solder bump 136 may be used to electrically connect the semiconductor device 198 with the PCB substrate and include a stud 132 and a solder ball 134. The stud 132 may be deposited on the metal barrier layer 120. Thus, the stud 132 may be provided in the form of a column with a cross-sectional shape corresponding to the shape of the metal barrier layer 120 in plan view. For example, if the metal barrier layer 120 has a circular shape in plan view, the stud 132 may have a cylindrical shape. The stud 132 may be adjusted to control the height of the solder bump 136 functioning as a connector. In other words, the stud 132 may allow the solder bump 136 to have an appropriate height for adhesion of the semiconductor device 198 with the PCB substrate. The stud 132 may be formed to a height of about 30 µm to about 50 µm. Also, the solder ball 134 may be formed in a substantially hemispherical shape on the stud 132.

The second recess 152 may be formed by recessing the insulating layer 116'. For example, as shown in FIG. 1, a lateral cross-section of the second recess 152 may have a substantially rectangular shape. Alternatively, the lateral cross-section of the second recess 152 may have a substantially hemispherical or substantially inverse-trapezoidal shape. The recessed depth of the insulating layer 116' may correspond to an exposed surface of the buffer layer 114'. Also, in plan view, the second recess 152 may have an annular shape, which is spaced a predetermined distance apart from the first recess 150 with a portion of the insulating layer 116' (i.e., the portion of the insulating layer 116' designated as 116'a) therebetween and surrounds the first recess 150.

The stick or protrusion 160 may be formed by filling the second recess 152 with a conductive material such as a metal. The second recess 152 may be filled with the same material as the stud 132. In other words, the stick 160 may be integrally formed with the stud 132 of the solder bump 136. The stick 160 may absorb an external force applied to the solder bump 136 to prevent deformation of the solder bump 136 and occurrence of a crack between the solder bump 136 and the bonding pad 108.

The stick 160 will now be described in further detail.

Figure 3:
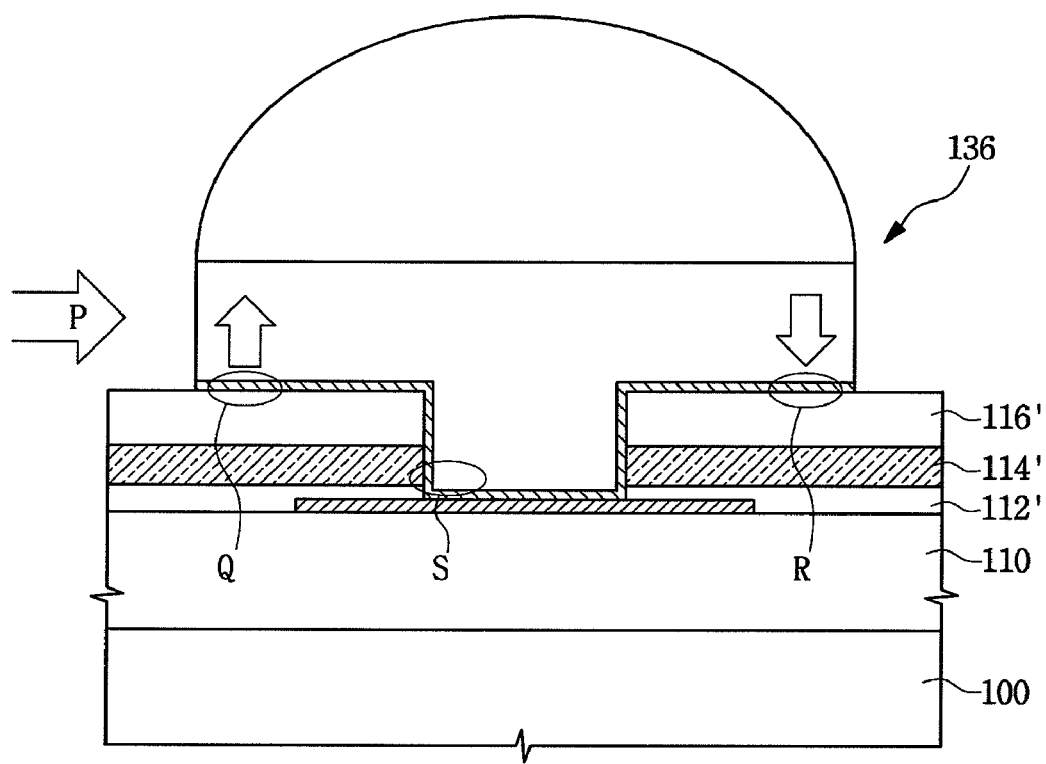
FIG. 3 is a schematic diagram showing stress applied to a solder bump due to an external force.

FIG. 3 is a schematic view showing application of an external force to the solder bump without the stick.

Referring to FIG. 3, an external force P may be applied to the solder bump 136 mainly in a horizontal direction of the semiconductor device. This is due to a difference in thermal expansion between the PCB substrate (not shown) on which the semiconductor device is mounted and the semiconductor device. When the external force P is applied to the solder bump 136 in the horizontal direction, a first portion Q of the solder bump 136 to which the external force P is applied may be lifted up, while a second portion R of the solder bump 136, opposite the first portion Q, may be pressed down. This may result in deformation of the solder bump 136, and a crack may occur at a spot S where the solder bump 136 faces the bonding pad 108. Also, the semiconductor substrate 100 may be broken due to the stress applied to the second portion R of the solder bump 136.

Thus, when the external force P is applied to the first portion Q of the solder bump 136, the stick 160 according to the present example embodiments may support the solder bump 136 to prevent the second portion R of the solder bump 136 from being pressed down. Specifically, since a top surface of the buffer layer 114' is supported by the stick 160 formed of a hard material, such as copper (Cu), even if the external force P is applied to a side surface of the solder bump 136, the deformation of the solder bump 136 may be prevented. In this case, the stick 160 may function as a prop or support structure.

FIGS. 4A through 4G are cross-sectional views illustrating a method of fabricating the semiconductor device of FIGS. 1 and 2. FIGS. 4A through 4G show mainly structures disposed on an interlayer insulating layer 110. Hereinafter, a method of fabricating the semiconductor device for a flip-chip bonding process, shown in FIGS. 1 and 2, will be described with reference to FIGS. 4A through 4G.

Figure 4A:
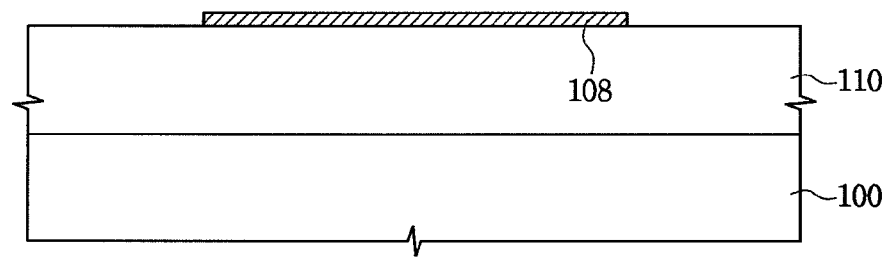
FIGS. 4A through 4G are cross-sectional views illustrating a method of fabricating the semiconductor device of FIGS. 1 and 2.

Referring to FIG. 4A, a bonding pad 108 may be formed on the interlayer insulating layer 110. Although not shown in the drawings, a transistor may be formed in an active region of the semiconductor substrate 100, and a via contact (not shown) may be formed in the interlayer insulating layer 110 formed on the semiconductor substrate 100. The via contact may be formed by selectively etching the interlayer insulating layer 110 to form a via hole therethrough and filling the via hole with a conductive material. The bonding pad 108 may be formed by depositing a conductive material such as a metal on the interlayer insulating layer 110 and patterning the conductive material. The bonding pad 108 may be formed of Al, Cu, or other conductive materials having a low resistivity.

Figure 4B:
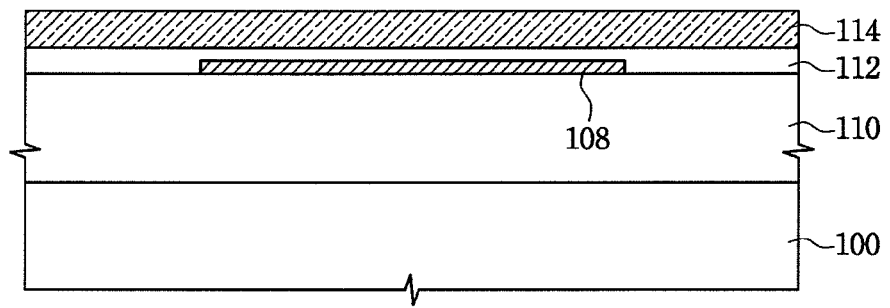

Referring to FIG. 4B, a passivation material 112 and a buffer material 114 may be formed on the interlayer insulating layer 110 having the bonding pad 108 to cover the bonding pad 108 and the interlayer insulating layer 110. Silicon nitride (SiN) may be used as the passivation material 112 to form a passivation layer 112'. The passivation material 112 may be formed to a thickness of about 1 µm. The buffer material 114 may be PSPI. The buffer material 114 may be formed to a thickness of about 4 µm to about 5 µm.

Figure 4C:
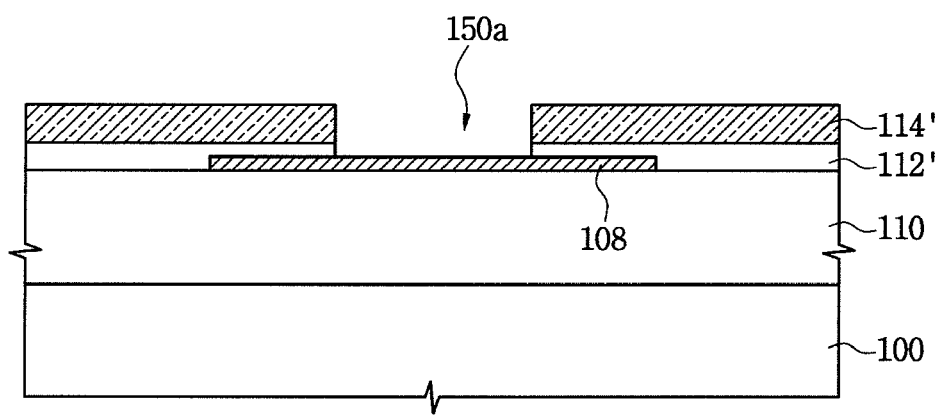

Referring to FIG. 4C, the passivation material 112 and the buffer material 114 may be selectively etched to form a certain recess 150a, thereby forming a passivation layer 112' and a buffer layer 114'. In other words, the passivation layer 112' and the buffer layer 114' may be patterned to expose the bonding pad 108. In this case, the certain recess 150a may be formed by selectively patterning the buffer material 114. The buffer material 114, which may be an organic material such as PSPI, may be patterned using photolithography and etching processes. The passivation material 112 may then be etched using the patterned buffer layer 114' as an etch mask to define the certain recess 150a. As a result, the passivation layer 112' having the first certain recess 150 may be formed.

Figure 4D:
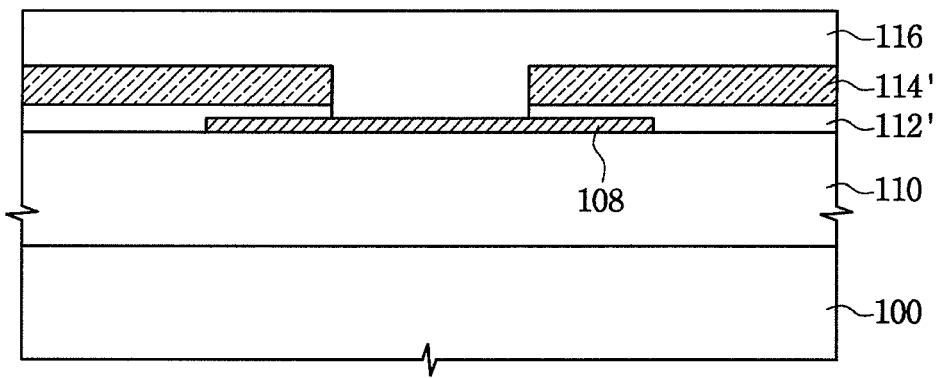

Referring to FIG. 4D, an insulating material 116 may be deposited to cover the bonding pad 108, the passivation layer 112' and the buffer layer 114'. The insulating material 116 may be a dielectric material such as a phenol resin or rubber particles.

Figure 4E:
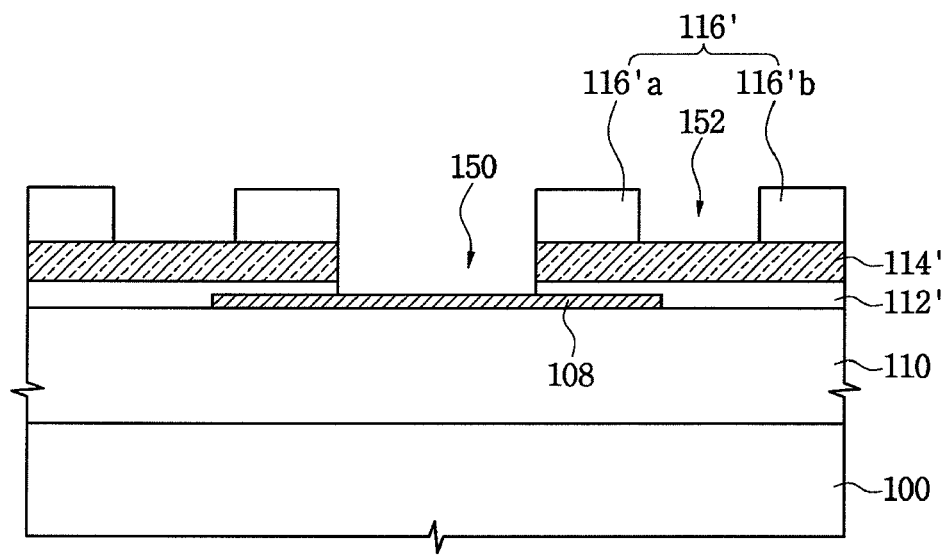

Referring to FIG. 4E, the insulating material 116 may be patterned to form an insulating layer 116', thereby forming a first recess 150. The insulating layer 116' may include an inner region 116'a and an outer region 116'b, which are ring-like as illustrated in FIG. 2. The first recess 150 is formed inside the inner region 116'a, and the second recess 150 can be formed between the inner region 116'a and the outer region 116'b. Thus, the first recess 150 exposing the bonding pad 108 may be formed on one side of the inner region 116'a of the insulating layer 116'. The first recess 150 may be formed in the buffer layer 114' and the passivation layer 112'. A second recess 152 may be formed on the other side of the inner region 116'a of the insulating layer 116' adjacent to the first recess 150 such that the inner region 116'a of the insulating layer 116' is interposed between the first and second recesses 150 and 152. The second recess 152 may be formed in a concave shape spaced apart from the first recess 150. Also, in plan view, the second recess 152 may be formed in an annular shape to surround the first recess 150 as shown in FIG. 2.

Figure 4F:
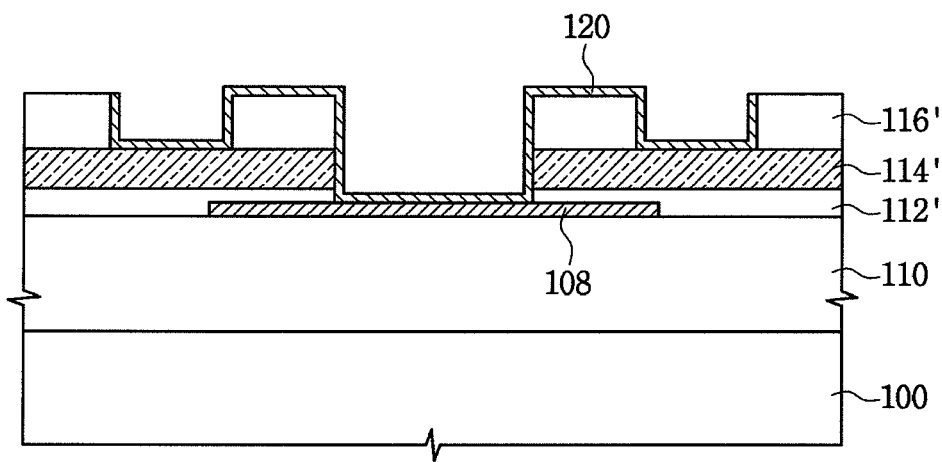

Referring to FIG. 4F, a metal barrier layer 120 may be formed on the resulting structure. The metal barrier layer 120 may be conformally formed on at least the bonding pad 108, which is exposed by the first recess 150, and on the insulating layer 116'. Furthermore, the metal barrier layer 120 may be formed on an inner surface of the second recess 152 obtained by etching the insulating layer 116'. That is, in plan view, the metal barrier layer 120 may be provided in the form of a circle having a radius extending from the center of the first recess 150 to an outer edge of the second recess 152. The metal barrier layer 120 may be formed of, for example, Ti, Cu, or Ni.

Figure 4G:
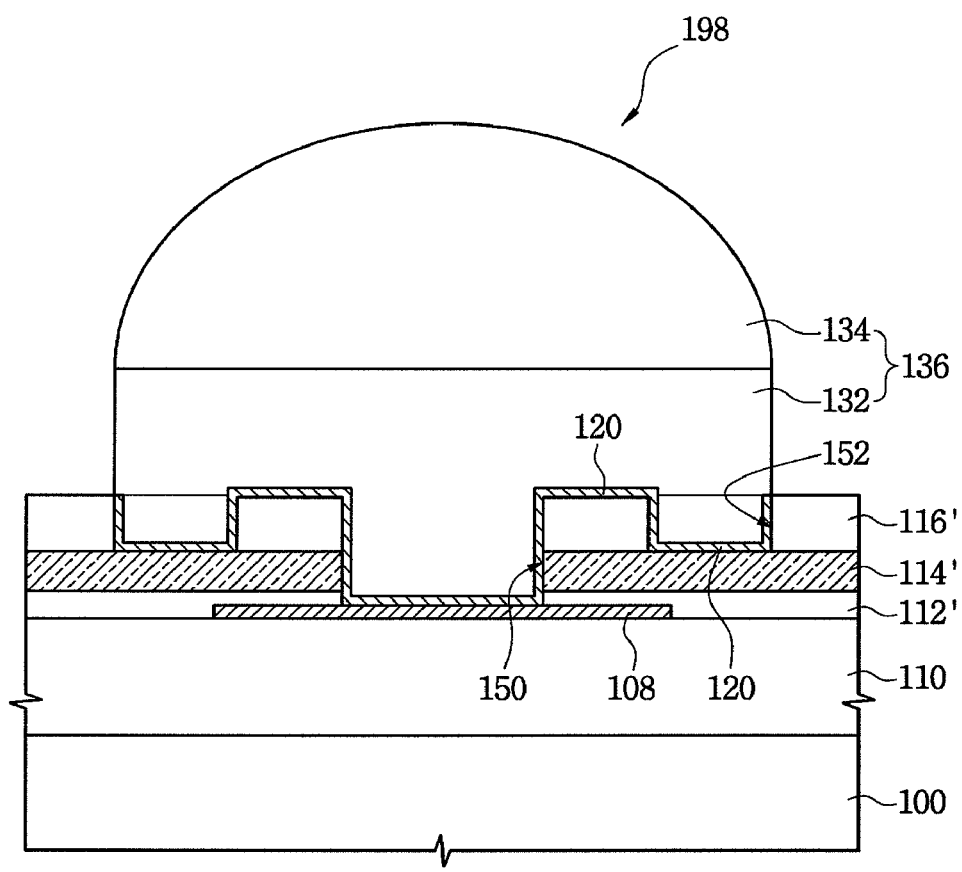

Referring to FIG. 4G, a conductive ball or conductive bump such as a solder bump 136 may be formed to be connected to the bonding pad 108. In one embodiment, a stud 132 may be formed on the metal barrier layer 120. The stud 132 may be formed in a cylindrical shape to a height of about 30 μm to about 50 μm. The stud 132 may be formed of, for example, Cu. Also, the stud 132 may be formed by using an electroless plating process to have an appropriate height. Next, a solder ball 134 may be formed thereon using a solder paste. In particular, a mask corresponding to the shape of the stud 132 may be aligned on the insulating layer 116' and coated with the solder paste, thereby forming the solder ball 134 on the stud 132. In some embodiments, a conductive ball or bump 136 may be coupled to the bonding pad 108 without the stud 132 disposed therebetween.

Embodiment 2

Hereinafter, a semiconductor device 298 for a flip-chip bonding process according to other example embodiments will be described with reference to FIGS. 5, 6, and 7A through 7E. For the sake of brevity, a detailed description of the same components as in Embodiment 1 will be omitted.

The semiconductor device 298 for a flip-chip bonding process according to the present example embodiments may include a semiconductor substrate 200, a bonding pad 208 disposed on the semiconductor substrate 200, and a conductive bump such as a solder bump 236 used to electrically connect the semiconductor device with a PCB substrate (not shown). Also, a passivation layer 212', a buffer layer 214', and an insulating layer 216' may be sequentially stacked on the semiconductor substrate 200. The insulating layer 216', the buffer layer 214', and the passivation layer 212' may include a first recess 250 exposing the bonding pad 208. Also, the insulating layer 216' may further include a stick 260 to support the solder bump 236.

The passivation layer 212' may be used to protect the semiconductor substrate 200 from external contaminants. The buffer layer 214' may be used to reduce stress applied to the semiconductor device 298. The insulating layer 216' may have a redistribution layer (not shown) included therein.

The first recess 250 may be formed by patterning the passivation layer 212', the buffer layer 214', and the insulating layer 216' to expose the bonding pad 208. In plan view, the first recess 250 may have a substantially circular shape or a nearly circular polygonal shape. Also, the cross-sectional area of the first recess 250 may be controlled to be about 20% to about 30% of the cross-sectional area of the solder bump 236. The first recess 250 may be used to expose the bonding pad 208. Thus, the bonding pad 208 may be electrically connected to the solder bump 236 through the first recess 250.

A metal barrier layer 220 may be stacked on the inner surface of the first recess 250 and a region where the solder bump 236 will be formed. The metal barrier layer 220 may facilitate the bonding of the solder bump 236 with the bonding pad 208. The metal barrier layer 220 may be formed of, for example, Ti, Cu, or Ni.

The solder bump 236 may include a stud 232 and the solder ball 234. The stud 232 may be required to control the height of the solder bump 236. A portion of the stud 232 may fill the second recess 252 and form the stick 260. In some embodiments, the bump 236 may be coupled to the bonding pad 208 without the stud 232 disposed therebetween. The second recess 252 may have a concave shape around the first recess 250. The second recess 252 may be obtained by patterning the insulating layer 216' and the buffer layer 214'. That is, the second recess 252 may be patterned to such a depth as to expose the passivation layer 212'. Also, in plan view, the second recess 252 may have a substantially circular shape to be spaced apart from the first recess 250 and substantially surround the first recess 250.

The stick 260 may be obtained by filling the second recess 252 with a conductive material such as a metal. Thus, the conductive material filled in the second recess 252 may be a portion of the stud 232.

According to the present example embodiments, since the second recess 252 is extended to a greater depth than the second recess 152 shown in Embodiment 1, the stick 260 may support the solder bump 236 more effectively. In Embodiment 1, since the second recess 152 is formed within the insulating layer 116', the stick 160 may be mounted on a top surface of the buffer layer 114' configured to reduce stress applied to the semiconductor device 198. Accordingly, although the stick 160 is supported more stably by the buffer layer 114', the function of the stick 160 may be weakened to some extent due to a relatively small depth of the second recess 152. However, in Embodiment 2, the second recess 252 may be formed to such a great depth as to remove substantially all of the insulating layer 216' and the buffer layer 214' thereunder. Accordingly, although the stick 260 is not supported by the buffer layer 214' but only by the passivation layer 212', the function of the stick 260 may be strengthened.

Figure 5:
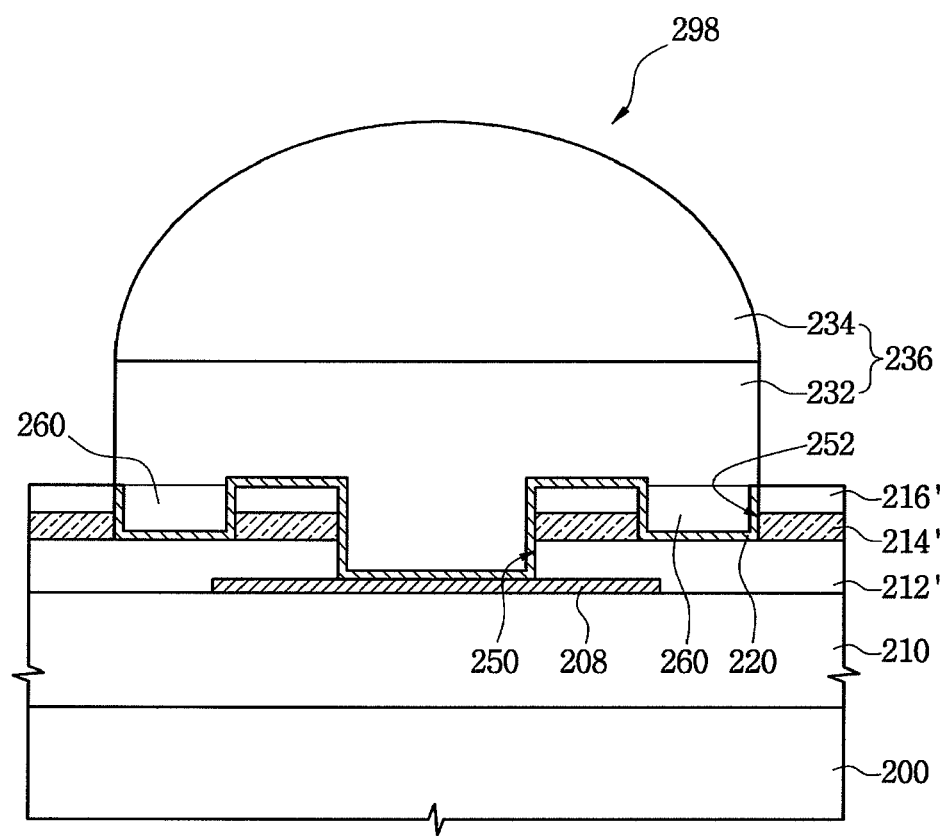
FIGS. 5 and 6 are cross-sectional and plan views of a semiconductor device having a bump with a stick or protrusion according to a second example embodiment, respectively.
Figure 6:
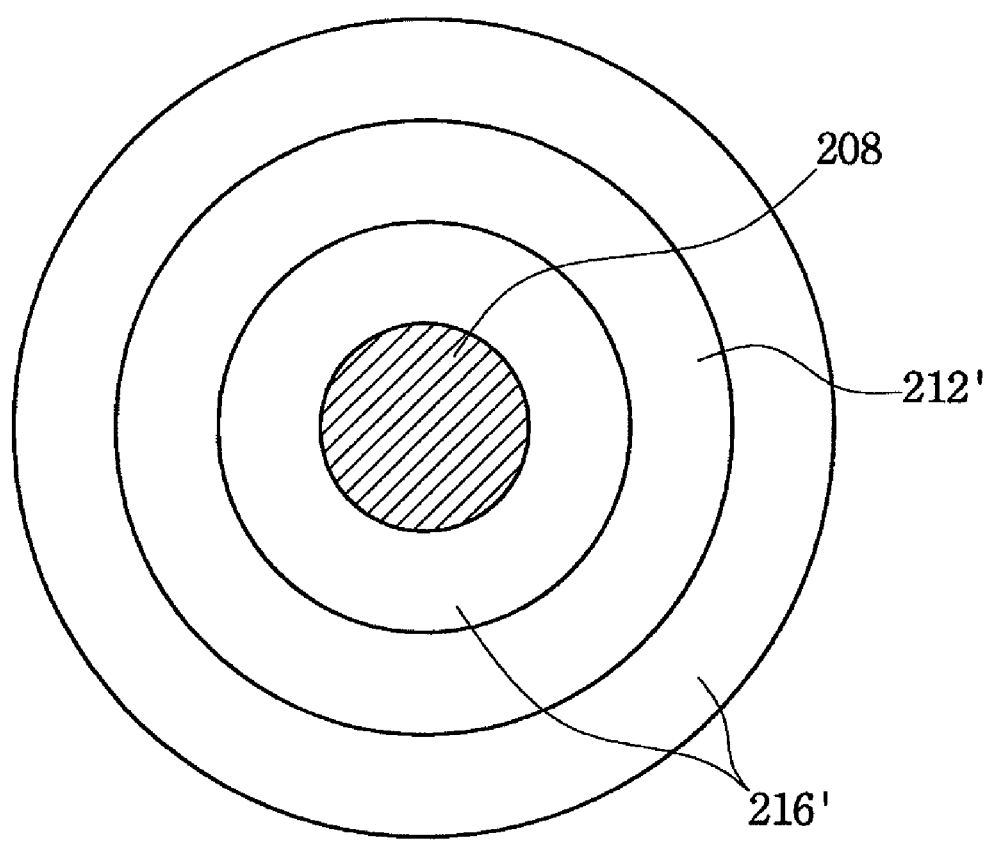

FIGS. 7A through 7E are cross-sectional views illustrating a method of fabricating the semiconductor device of FIGS. 5 and 6. For the sake of brevity, 7A through 7E show only structures disposed on an interlayer insulating layer 210 formed on a semiconductor substrate 200. Hereinafter, a method of fabricating the semiconductor device for a flip-chip bonding process, shown in FIGS. 5 and 6, will be described with reference to FIGS. 7A through 7E. In the present example embodiments, a description of the same or similar structures as in Embodiment 1 will be omitted.

Figure 7A:
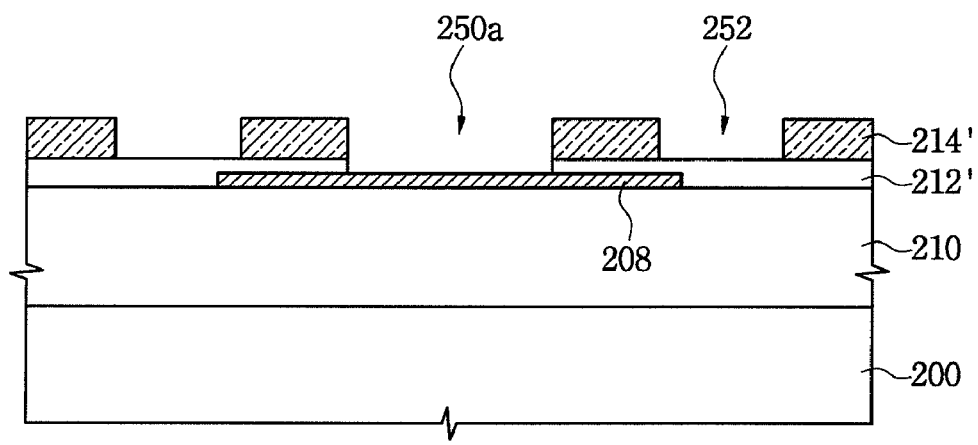
FIGS. 7A through 7E are cross-sectional views illustrating a method of fabricating the semiconductor device of FIGS. 5 and 6.

Referring to FIG. 7A, a bonding pad 208 may be formed on the interlayer insulating layer 210 stacked on the semiconductor substrate 200. A passivation layer 212' and a buffer layer 214' may be formed to expose the bonding pad 208. Also, the buffer layer 214' may be patterned to form a second recess 252.

Specifically, the interlayer insulating layer 210 may be initially formed on the semiconductor substrate 200 having semiconductor devices. A conductive layer formed of a conductive material such as a metal may be deposited on the interlayer insulating layer 210 and patterned, thereby forming the bonding pad 208. The bonding pad 208 may be formed of a metal having a low resistivity, such as Al or Cu.

Thereafter, a passivation material and a buffer material may be sequentially stacked on the interlayer insulating layer 210 to cover the bonding pad 208. In this case, the passivation material may be SiN, and the buffer material may be PSPI.

A buffer layer 214' may be formed to have a certain recess 250a exposing at least a region of the bonding pad 208. An etch process may be performed using the buffer layer 214' having the certain recess 250a as an etch mask so that the passivation layer 212' also may have the certain recess 250a. Also, the buffer layer 214' may be patterned using photolithography and etching processes and have the second recess 252.

Figure 7B:
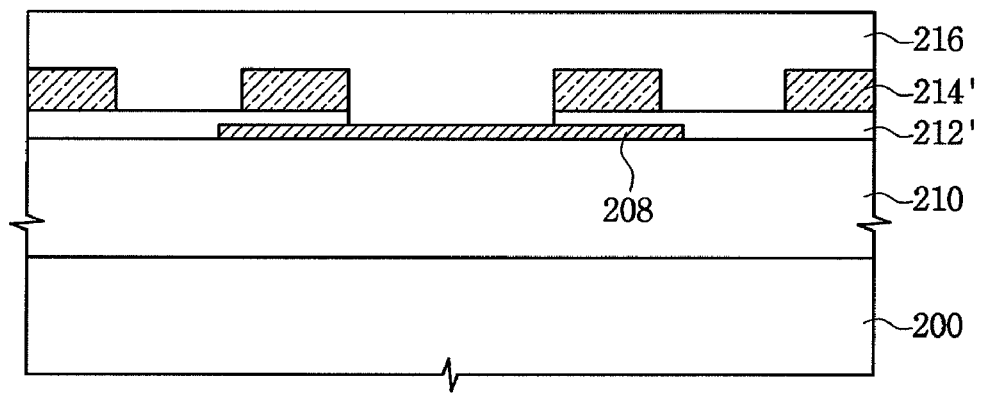

Referring to FIG. 7B, an insulating material 216 may be formed to cover the passivation layer 212' and the buffer layer 214'. The insulating material 216 may be, for example, a phenol resin or rubber particles.

Figure 7C:
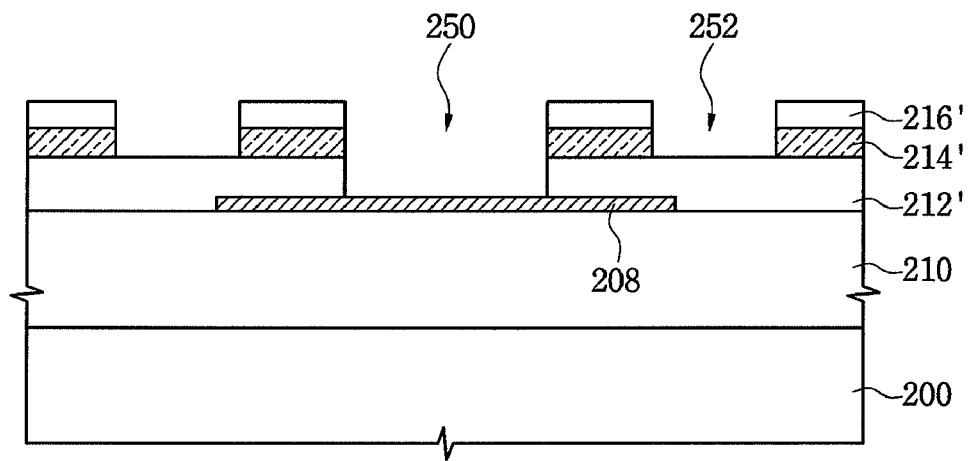

Referring to FIG. 7C, the insulating material 216 may be patterned to form an insulating layer 216'. In this case, the insulating material 216 may be patterned to have first and second recesses 250 and 252. The insulating layer 216' may be patterned to form the first recess 250 exposing at least a region of the bonding pad 208. Simultaneously, the insulating layer 216' may be patterned to form the second recess 252 for forming a stick or protrusion 260. The second recess 252 may be formed in a concave shape spaced apart from the first recess 250. Also, in plan view, the second recess 252 may be formed in an annular shape to surround the first recess 250. The second recess 252 may be formed during an etching process of forming the first recess 250.

Figure 7D:
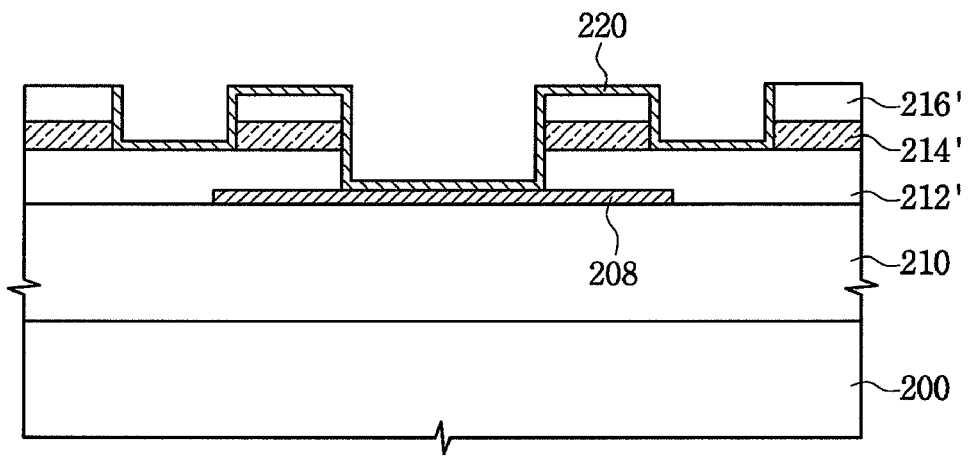

Referring to FIG. 7D, a metal barrier layer 220 may be formed on a region where a solder bump 236 will be formed. The metal barrier layer 220 may be formed on an inner surface of the first recess 250, an inner surface of the second recess 252, and a portion of the insulating layer 216' between the first and second recesses 250 and 252. That is, the metal barrier layer 220 may be provided in the form of a circle having a radius extending from the center of the first recess 250 to an outer end of the second recess 252. In particular, the metal barrier layer 220 may be formed by depositing a metal material on the insulating layer 216' having the first recess 250 and patterning the metal material. The metal barrier layer 220 may be formed of, for example, Ti, Cu, or Ni.

Figure 7E:
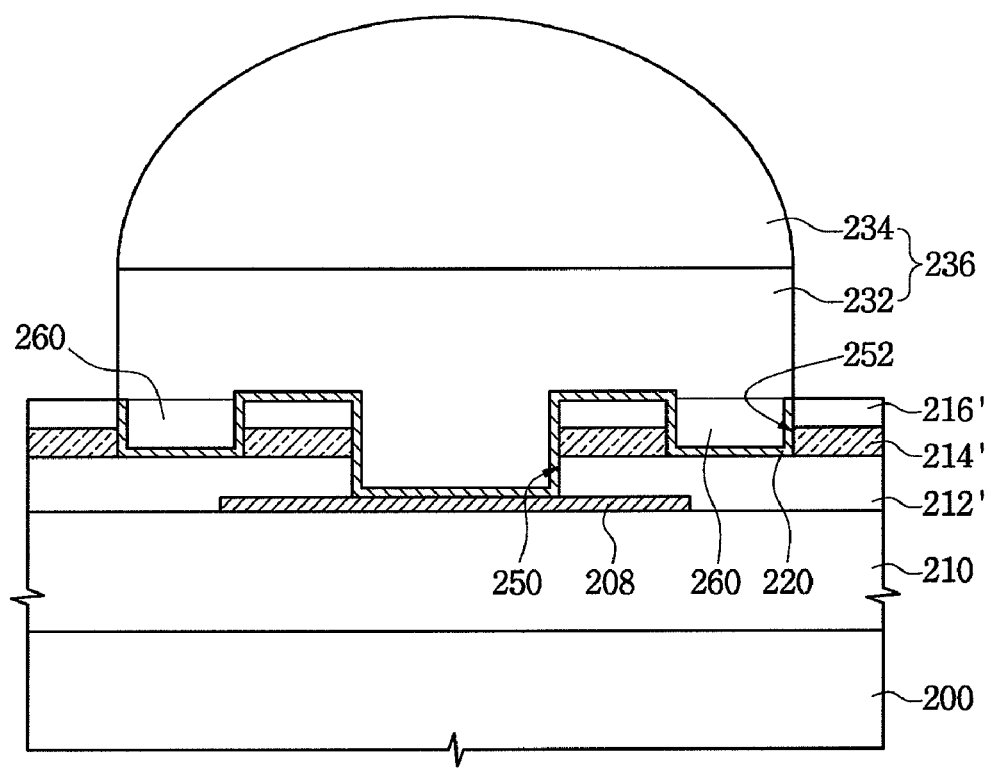

Referring to FIG. 7E, a solder bump 236 may be formed to be connected to the bonding pad 208. In particular, a stud 232 may be formed on the metal barrier layer 220. The stud 232 may be formed of, for example, Cu. That is, the stud 232 may be formed by plating the metal barrier layer 220 with Cu using an electroless plating process. Next, the stud 232 may be coated with a solder paste to form a solder ball 234. That is, the solder paste may be coated using a mask corresponding to the arrangement and shape of the stud 232, thereby forming the solder ball 234 on the stud 232. In some embodiments, the bump 236 may be coupled to the bonding pad 208 without the stud 232 disposed therebetween.

Embodiment 3

Figure 8:
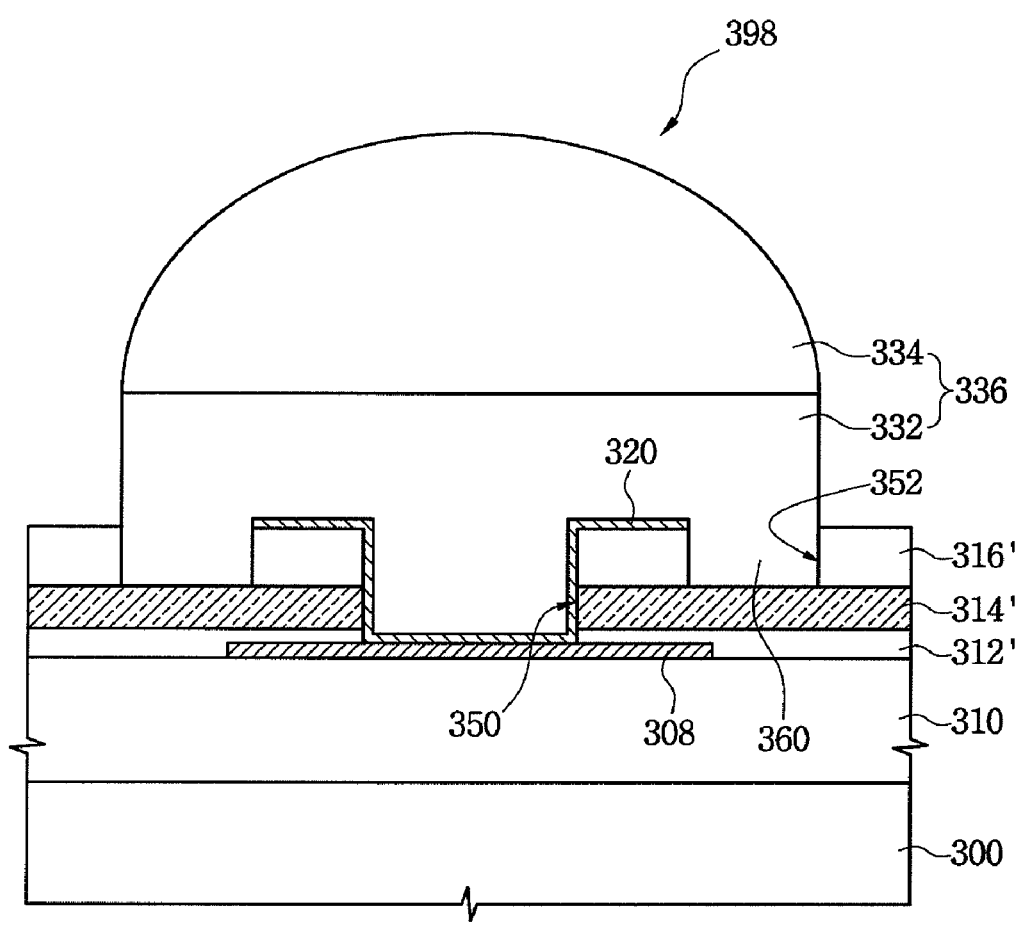
FIG. 8 is a cross-sectional view of a semiconductor device having a bump with a stick or protrusion according to a third example embodiment.
Figure 9A:
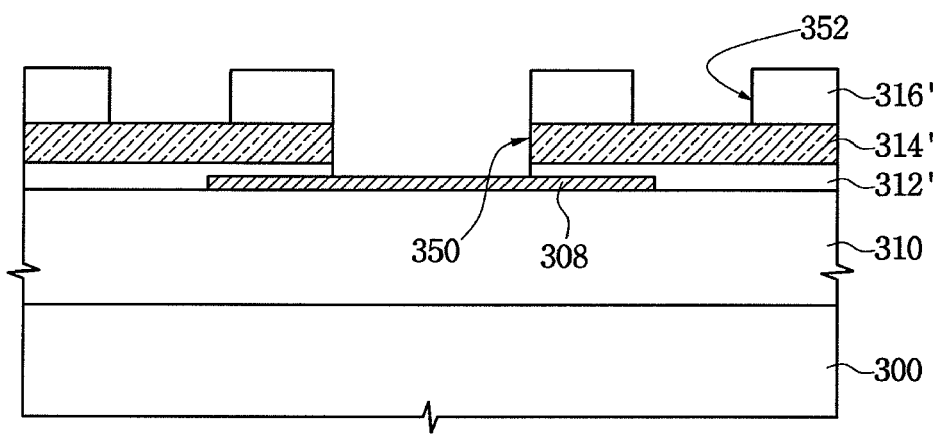
FIGS. 9A through 9C are cross-sectional views illustrating a method of fabricating the semiconductor device of FIG. 8.
Figure 9B:
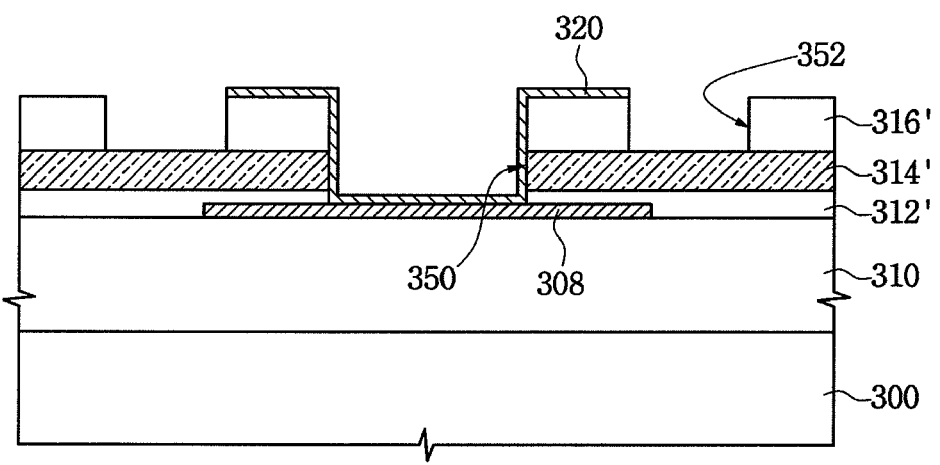
Figure 9C:
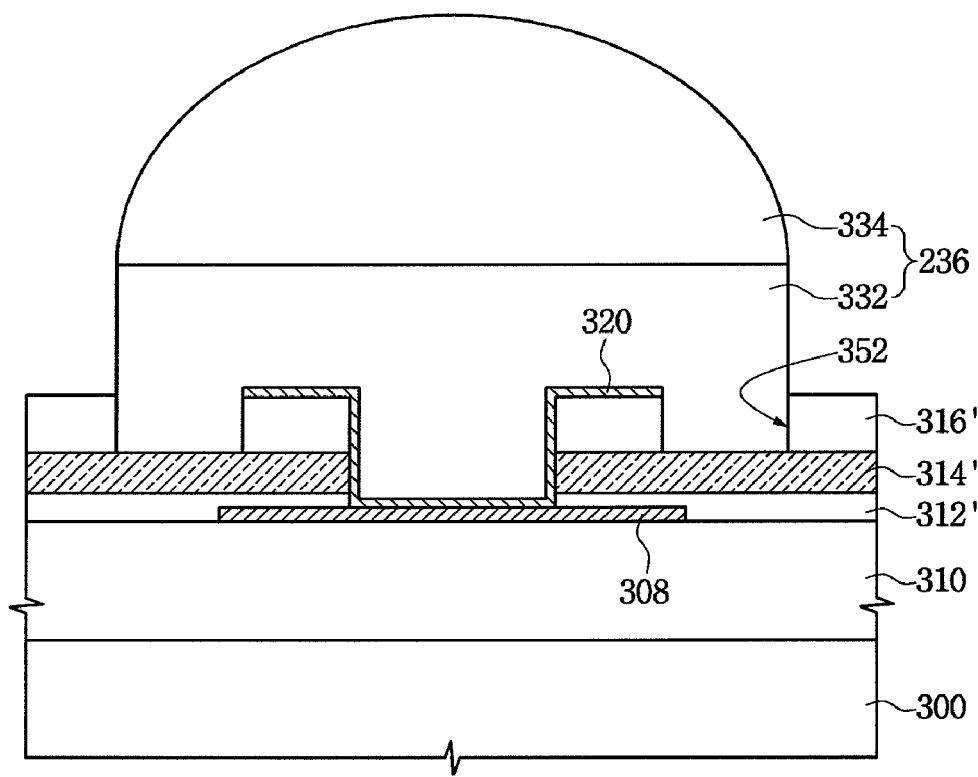

FIG. 8 is a cross-sectional view of a semiconductor device 398 having a bump 336 with a stick or protrusion 360 according to a third example embodiment, and FIGS. 9A through 9C are cross-sectional views illustrating a method of fabricating the semiconductor device 398 of FIG. 8.

Referring to FIG. 8, the semiconductor device 398 for a flip-chip bonding process according to the present example embodiments may include a semiconductor substrate 300, a bonding pad 308 disposed on the semiconductor substrate 300, and a conductive bump, e.g., a solder bump 336 used to electrically connect the semiconductor device 398 with a PCB substrate (not shown). Also, a passivation layer 312', a buffer layer 314', and an insulating layer 316' may be sequentially stacked on the semiconductor substrate 300. The insulating layer 316', the buffer layer 314', and the passivation layer 312' may include a first recess 350 exposing the bonding pad 308. A stick 360 may be obtained by filling a second recess 352 of the insulating layer 316' with a conductive material such as a metal. In this case, the stick 360 may not be physically bonded to the second recess 352.

The passivation layer 312' may protect the semiconductor substrate 300 from external contaminants. The buffer layer 314' may be used to reduce stress applied to the semiconductor device 398. The insulating layer 316' may include a redistribution layer (not shown) formed therein.

The first recess 350 may be used to expose the bonding pad 108. To do this, the first recess 350 may be obtained by patterning the insulating layer 316', the buffer layer 314', and the passivation layer 312'.

A metal barrier layer 320 may be provided to facilitate the bonding of the solder bump 336 with the bonding pad 308. The metal barrier layer 320 may be formed on an inner surface of the first recess 350 and on a portion of the insulating layer 316' adjacent to the first recess 350.

According to the present example embodiments, the metal barrier layer 320 may not be formed in the second recess 352. Thus, although the stick 360 is formed by filling the second recess 352 with the metal material, since the metal barrier layer 320 is not present in the second recess 352, the metal material filling the second recess 352 may not be completely bonded to the second recess 352.

When the metal material is physically reliably bonded to the second recess 352 due to the metal barrier layer 320, a crack may occur between the stick 360 and the buffer layer 314' in the second recess 352. In other words, the metal barrier layer 320 may produce an adverse side effect of concentrating a load on a bonding point between the stick 360 and the buffer layer 314' instead of dispersing a load applied to the buffer layer 314' through the stick 360.

Accordingly, according to the present example embodiments, since the metal material forming the stick 360 is not completely physically bonded to the inner surface of the second recess 352, a stress or external force applied between the stick 360 and the buffer layer 314' disposed thereunder may be dispersed. In this case, the function of the stick 360 may be effectively embodied.

FIGS. 9A through 9C are cross-sectional views illustrating a method of fabricating the semiconductor device 398 of FIG. 8.

Referring to FIG. 9A, a bonding pad 308 may be formed on an interlayer insulating layer 310 stacked on a semiconductor substrate 300. Also, a passivation layer 312' and a buffer layer 314' may be formed to expose the bonding pad 308. An insulating layer 316' may be formed on the buffer layer 314' to form a first recess 350 and a second recess 352. The insulating layer 316' may be formed by coating the bonding pad 308 and the passivation layer 312' with an insulating material and patterning the insulating material. The insulating layer 316' may be patterned to have the first recess 350 exposing at least a portion of the bonding pad 308. Also, the insulating layer 316' may be patterned to have the second recess 352 to form a stick 360.

Referring to FIG. 9B, a metal barrier layer 320 may be formed only on a portion of the bonding pad 308, which is exposed by the first recess 350, and the insulating layer 316'. Thus, the metal barrier layer 320 may not be formed in the second recess 352. The metal barrier layer 320 may be formed of Ti, Cu, or Ni.

Referring to FIG. 9C, a solder bump 336 may be formed to be electrically connected to the bonding pad 308. The formation of the solder bump 336 may include forming a stud 332. The stud 332 may be formed of Cu. In this case, since the metal barrier layer 320 is not formed in the second recess 352, the stud 332 may not be completely bonded to the second recess 352. In some embodiments, the bump 336 may be coupled to the bonding pad 308 without the stud 332 disposed therebetween.

Embodiment 4

Figure 10:
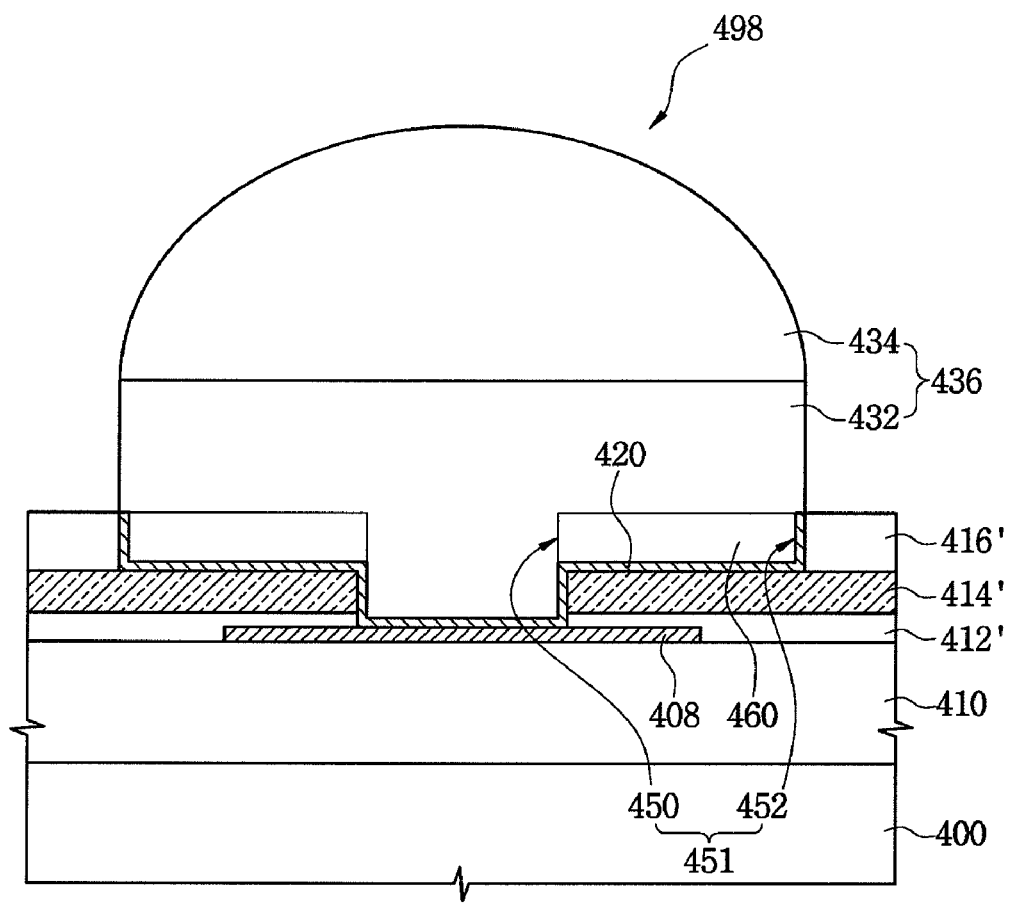
FIGS. 10 and 11 are cross-sectional and plan views of a semiconductor device having a bump with a stick according to a fourth example embodiment, respectively.
Figure 11:
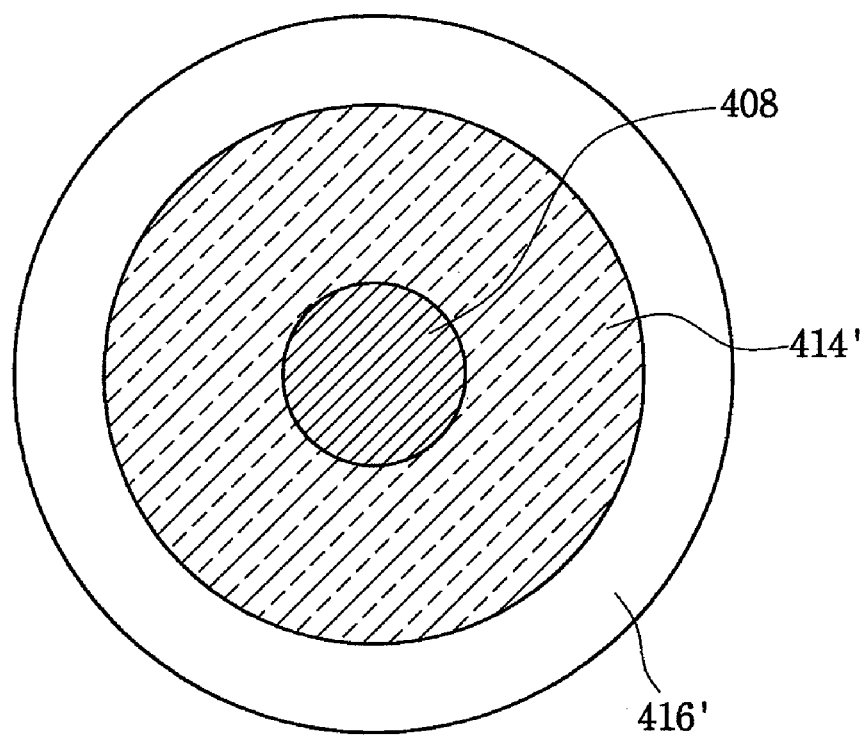

FIGS. 10 and 11 are cross-sectional and plan views of a semiconductor device 498 having a bump 436 with a stick or protrusion 460 according to a fourth example embodiment, respectively.

Referring to FIGS. 10 and 11, the semiconductor device 498 for a flip-chip bonding process according to the present example embodiments may include a semiconductor substrate 400, a bonding pad 408 disposed on the semiconductor substrate 400, and a solder bump 436 used to electrically connect the semiconductor device 498 with a PCB substrate (not shown). Also, a passivation layer 412', a buffer layer 414', and an insulating layer 416' may be sequentially stacked on the semiconductor substrate 400. The insulating layer 416', the buffer layer 414', and the passivation layer 412' may include a first recess 450 exposing at least a portion of the bonding pad 408. Also, a stick or protrusion 460 may be disposed adjacent the first recess 450 as shown in FIG. 10.

The passivation layer 412' and the buffer layer 414' may be used to protect the semiconductor substrate 400 from external contaminants and an external force. The insulating layer 416' may include a redistribution layer (not shown) formed therein. The first recess 450 may be used to expose the bonding pad 408. In particular, the first recess 450 may be obtained by patterning the insulating layer 416', the buffer layer 414', and the passivation layer 412'. A metal barrier layer 420 may be conformally formed in the first recess 450 and a second recess 452. In some embodiments, the first and second recesses 450, 452 may be seen to collectively form a single recess 451 as shown in FIG. 10. There is a step formed between the recesses 450, 452 as shown, by virtue of the difference in depth of the two recesses 450, 452, the first recess 450 being deeper than the second recess 452. The first recess 450 may be disposed above the bonding pad 408, and the second recess 452 is above the buffer layer 414', also as shown. The first and second recesses 450, 452 may be seen to present a stepped but contiguously extending surface uninterrupted by, for example, the inner region 116'a of embodiment 1 illustrated in FIG. 1. The solder bump 436, which electrically connects the semiconductor device 498 with the PCB substrate (not shown), may include a stud 432 and a solder ball 434. In some embodiments, the bump 436 may be coupled to the bonding pad 408 without the stud 432 disposed therebetween.

A stick or protrusion 460 may be formed by filling the second recess 452 with a conductive material such as a metal. The conductive material filling the second recess 452 may be a portion of the stud 432 of the solder bump 436.

According to the present example embodiments, since the insulating layer 416' is not interposed between the first and second recesses 450 and 452, a patterning process may be easily performed and an area supported by the stick 460 may be substantially increased.

FIGS. 12A through 12E are cross-sectional views illustrating a method of fabricating the semiconductor device of FIGS. 10 and 11.

Figure 12A:
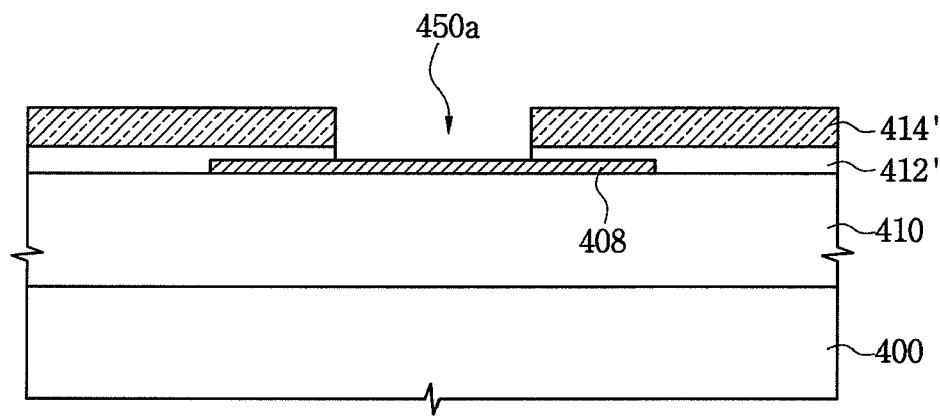
FIGS. 12A through 12E are cross-sectional views illustrating a method of fabricating the semiconductor device of FIGS. 10 and 11.

Referring to FIG. 12A, a bonding pad 408 may be formed on an interlayer insulating layer 410 stacked on a semiconductor substrate 400. Also, a passivation layer 412' and a buffer layer 414' may be formed on the interlayer insulating layer 410 to expose the bonding pad 408. In particular, a passivation material and a buffer material may be formed to cover the bonding pad 408 and then selectively etched to form a certain recess 450a exposing the bonding pad 408.

Figure 12B:
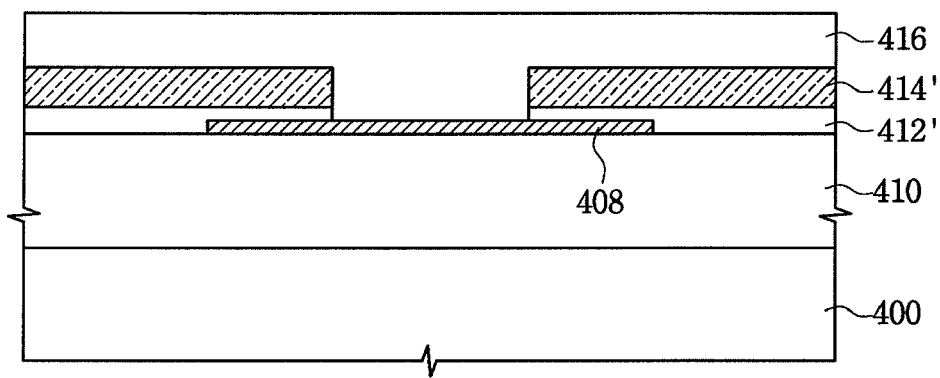

Referring to FIG. 12B, an insulating material 416 may be formed to cover the bonding pad 408 and the passivation layer 412'.

Figure 12C:
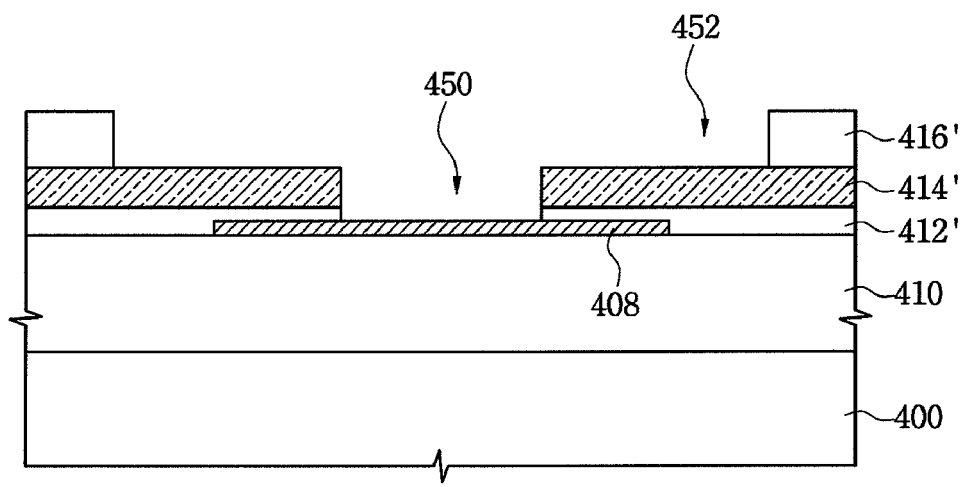

Referring to FIG. 12C, the insulating material 416 may be patterned to have a first recess 450 and a second recess 452, thereby forming an insulating layer 416'. The first recess 450 may be used to expose at least a portion of the bonding pad 408. The second recess 452 may be defined by a step formed by partially removing the insulating layer 416'. Thus, the second recess 452 may be connected to the first recess 450. That is, in plan view, the second recess 452 may be formed in an annular shape to surround and to be in direct communication with the first recess 450 as shown in FIGS. 10-11.

Figure 12D:
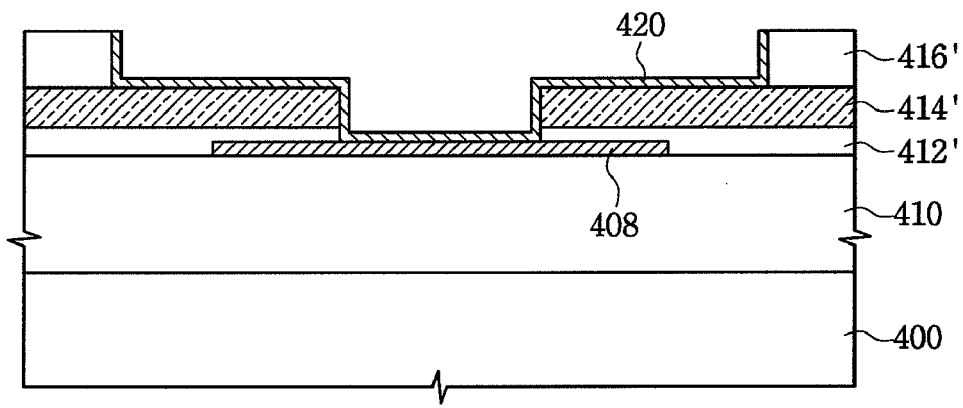

Referring to FIG. 12D, a metal barrier layer 420 may be formed in the first and second recesses 450 and 452. The metal barrier layer 420 may be formed of, for example, Ti, Cu, or Ni.

Figure 12E:
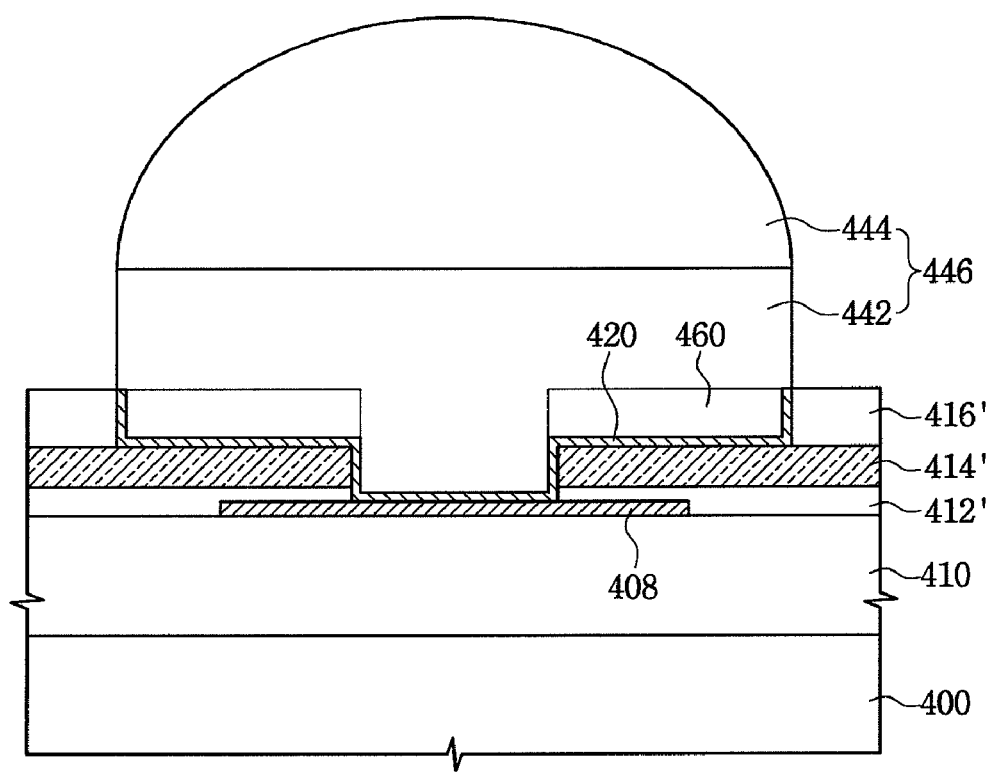

Referring to FIG. 12E, a solder bump 436 may be formed to be electrically connected to the bonding pad 408. In particular, a stud 432 may be formed on the metal barrier layer 420, and then a solder ball 434 may be formed of solder paste on the stud 432. In some embodiments, the bump 436 may be coupled to the bonding pad 408 without the stud 432 disposed therebetween.

Embodiment 5

In each of Embodiments 1 through 4, the first recess may have a substantially circular shape or a nearly circular polygonal shape. Also, in plan view, the second recess may have an annular shape to surround the first recess a predetermined distance apart from the first recess.

However, in the case of a small-sized semiconductor device, such as an FA-flip chip (Please spell out!), the first recess may not have a circular shape. Even if the first recess has a circular shape, there may not be a sufficient space for the second recess in an edge of the first recess, so that the stick filling the second recess cannot properly function as a support unit.

Accordingly, according to the present example embodiments, the first recess may have various shapes as opposed to a circular shape, and the second recess may also have a modified shape according to the shape of the first recess.

Figure 13:
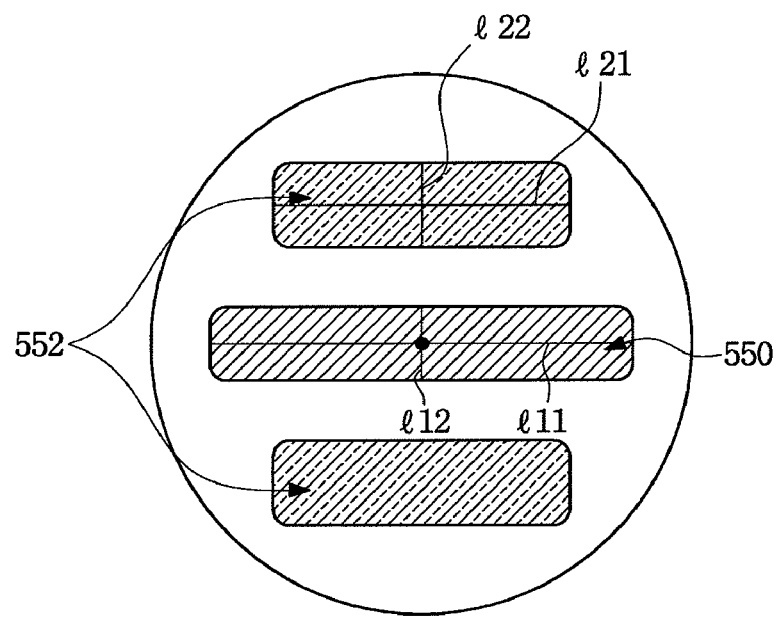
FIGS. 13 and 14 are plan views of solder lands of semiconductor devices according to a fifth example embodiment.
Figure 14:
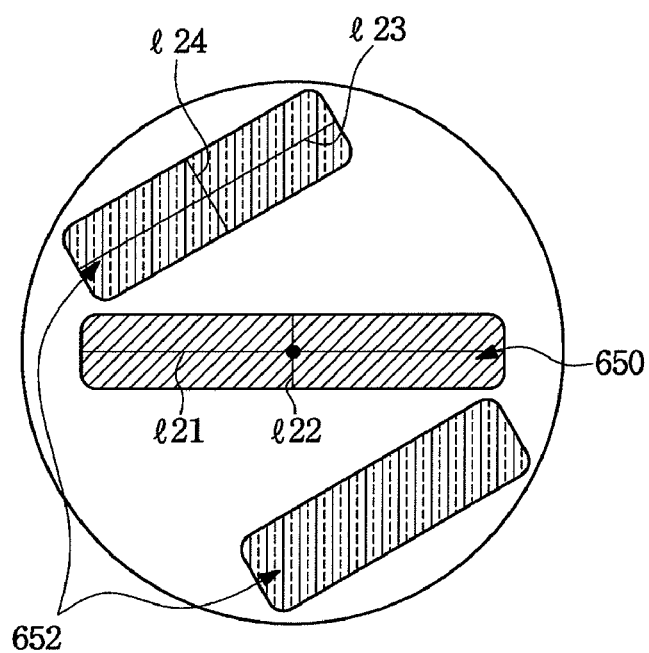

FIGS. 13 and 14 are plan views of solder lands of semiconductor devices according to a fifth example embodiment.

Referring to FIG. 13, a planar surface of a first recess 550 according to the present example embodiments may have a rectangular shape with rounded corners as opposed to a circular shape. The first recess 550 may have a block shape with major and minor axes having different lengths that are perpendicular to each other at the center thereof. In other words, the block-type first recess 550 may have a major axis 111 and a minor axis 112, which extend from the center thereof. For example, the first recess 550 may have a rectangular block shape, and the major axis 111 may be at least twice as long as the minor axis 112.

Also, a second recess 552 may be formed in a block shape adjacent the first recess 550. The second recess 552 may include at least one block. The second recess 552 may be disposed adjacent to the first recess 550, having a major axis 121 parallel to the major axis 111 of the first recess 550. In this case, a minor axis 122 arranged through the center of the second recess 552 may be disposed along an extension line of (i.e. coincide with) the minor axis 112 passing through the center of the first recess 550. In some embodiments, the second recess 552 may be spaced apart from the first recess 550. The above-described structure in which the first recess 550 has a shape that is longer on one side, as opposed to a circular shape, may be more advantageous for a solder land with smaller patterns.

FIG. 14 is a plan view showing the arrangement of a pair of blocks of a second recess according to a fifth example embodiment. Referring to FIG. 14, a block-type second recess 652 may be angled such that a minor axis 124 thereof deviates from an extension line of a minor axis 122 passing through the center of a first recess 650. In other words, when a major axis 123 of the second recess 652 is angled to deviate from the major axis 121 passing through the center of the first recess 650, the size of a solder land may be greatly reduced. Thus, the above-described structure may be further advantageous for highly integrated semiconductor devices.

Although FIGS. 13 and 14 illustrate that the blocks of the second recess 552 or 652 are formed on both sides of the first recess 550 or 650, the second recess 552 or 652 may be formed on only one side of the first recess 550 or 650. When the second recess 552 or 652 is formed on only one side of the first recess 550 or 650, a direction in which an external force P is applied should be considered. That is, the second recess 552 or 652 may be formed in an opposite direction to the direction in which the external force P is applied.

Embodiment 6

Figure 15:
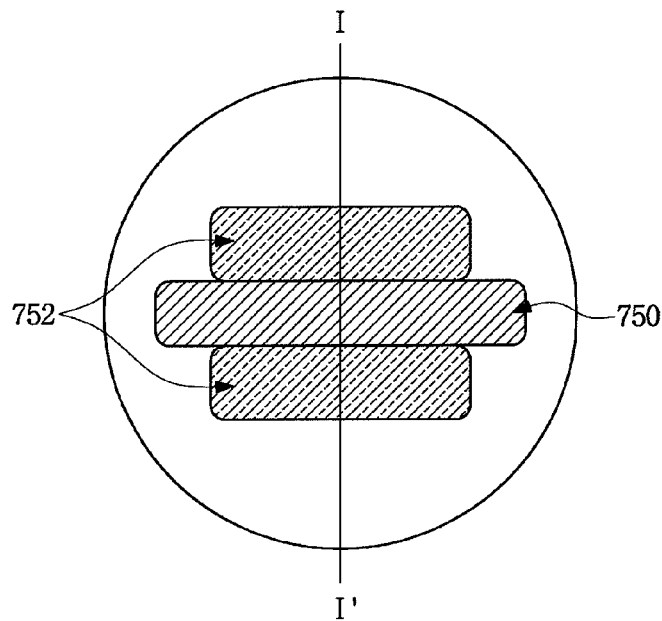
FIG. 15 is a plan view of a solder land of a semiconductor device according to a sixth example embodiment.

FIG. 15 is a plan view of a solder land of a semiconductor device according to a sixth example embodiment.

Referring to FIG. 15, a first recess 750 may have a block shape having axes with different lengths, which are perpendicular to each other and pass through the center of the first recess 750. For example, as shown in FIG. 15, the first recess 750 may have a substantially rectangular shape. Alternatively, although not shown, the first recess 750 may have a substantially elliptical shape.

A second recess 752 may also have a block shape. The block-type second recess 752 may contact a long side of the first recess 750. That is, a cross-section taken along line I-I' may have the same shape as described in Embodiment 4 with reference to FIG. 10. However, unlike Embodiment 4, according to the present example embodiments, the first recess 750 may have a shape that is longer in one direction, so that the solder land of the semiconductor device of FIG. 15 can be more suitable for highly integrated semiconductor devices.

Figure 16:
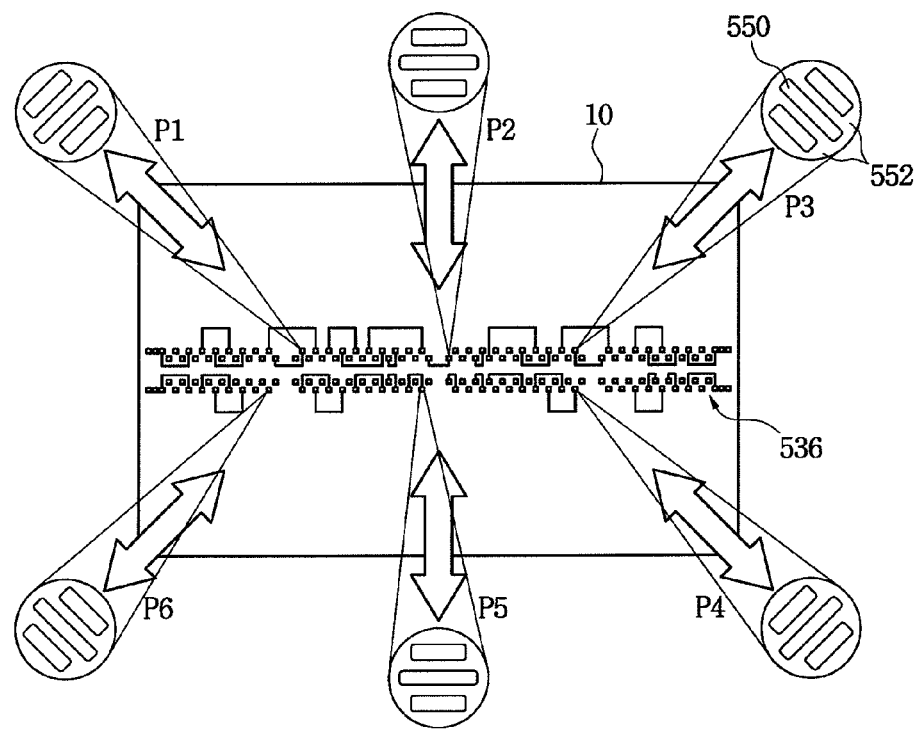
FIG. 16 is a plan view showing arrangement of a second recess in the semiconductor devices of FIGS. 13 through 15.

FIG. 16 is a plan view showing arrangement of the block-type second recess in the semiconductor devices of FIGS. 13 through 15. Specifically, FIG. 16 illustrates the block-type second recess of FIGS. 13 and 14. Since the block-type second recess does not completely surround the first recess, the arrangement of the second recess will now be described in more detail.

Referring to FIG. 16, solder bumps 536 may be arranged in a row around a central line of a semiconductor device. The second recesses 552 may also be disposed having minor axes that are arranged along the direction of external forces P1, P2, P3, P4, P5, and P6, or in other words, a straight line connecting the centers of the pair of blocks of the second recess 552 can be in the same direction as an external force applied to a side surface of the solder bump 536. Additionally, the second recesses 552 may have major axes that are arranged transverse (e.g., at right angles) to the direction of external forces P1, P2, P3, P4, P5, and P6.

This may be because an external force applied to the solder bump 536 is in the same direction as a central direction of the semiconductor device. As described above, the coefficient of a semiconductor device, which is adhered to a PCB substrate, may be different from that of the PCB substrate. Thus, when there is a temperature variation, the semiconductor device may be expanded or contracted so that an external force may be applied to the solder bump 536 functioning as a connector between the PCB substrate and the semiconductor device. Therefore, the second recess 552 for supporting the solder bump 536 may be disposed in the same direction as a direction in which the external force is applied.

Figure 17:
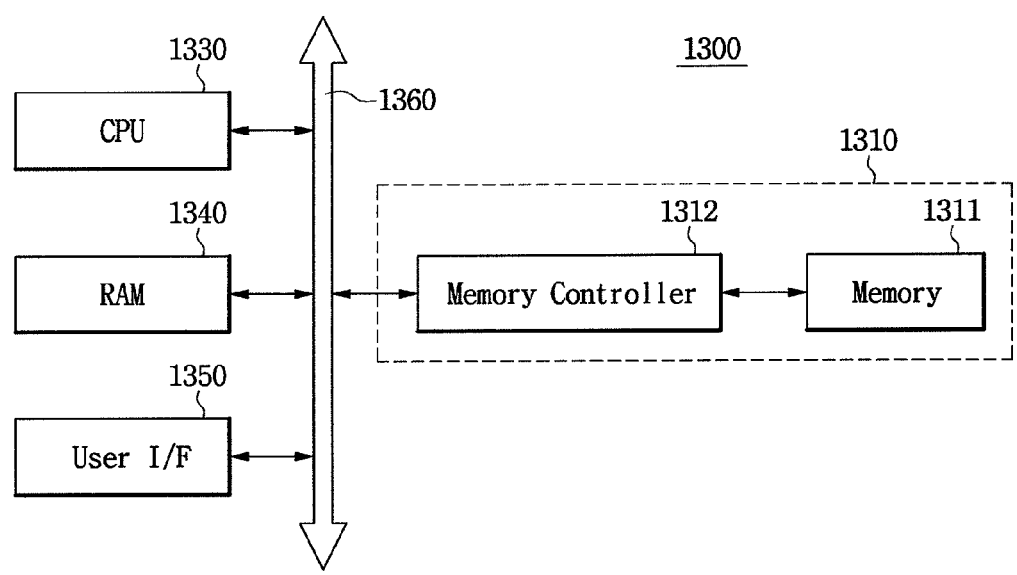
FIG. 17 is a block diagram illustrating an information processing system employing semiconductor devices according to exemplary embodiments of inventive concept.

FIG. 17 is a block diagram illustrating an information processing system employing semiconductor devices according to exemplary embodiments of inventive concept.

Referring to FIG. 17, the information processing system may include a memory system 1310 provided with semiconductor devices according to the exemplary embodiments of the inventive concept. Some or all of the semiconductor devices are formed according to the exemplary embodiments of the inventive concept. For example, the information processing system 1300 includes a memory system 1310, a central processing unit (CPU) 1330, a RAM 1340, and a user interface 1350 that are electrically connected to a system bus 1360, respectively. The memory system 1310 may include a memory 1311 and a memory controller 1312. Data processed by the CPU 1330 or inputted from the outside may be stored in the memory system 1310. The information processing system 1300 may be provided using a memory card, a solid-state disk (SSD), an image sensor, and other application chipsets. The information processing system may be a part of a PC such as a tablet PC, a MP3 player, a cellular phone or display devices.

In some embodiments, some or all of the semiconductor devices shown in FIG. 17 are formed in a single chip.

This inventive concept may be embodied in different forms and should not be construed as limited to the embodiments set forth herein.

According to the example embodiments as described above, the following effects can be expected.

First, a semiconductor device for a flip-chip bonding process can further include a stick formed around a first recess provided to bond a solder bump with a bonding pad, so that the solder bump can withstand an external force. That is, even if the solder bump sustains the external force, the stick can function as a support structure to prevent occurrence of a crack between the solder bump and the bonding pad.

Second, the stick can be supported on a buffer layer including PSPI, thereby further lessening stress.

Third, since a second recess is formed by recessing an insulating layer and the buffer layer, the depth and function of the stick that fills the second recess can be further increased.

Fourth, the second recess is formed adjacent to the first recess so that the cross-sectional area of the stick can be increased and a patterning process can be facilitated.

Fifth, since a metal barrier layer is not interposed between the stick and a buffer layer in the second recess, local stress caused by the bonding of the stick with the buffer layer can be not concentrated but dispersed.

Sixth, when the first recess is formed in a circular shape or nearly circular polygonal shape, the area of a solder land may be increased. However, when the first recess is formed in a block shape having a major axis and a minor axis, the area of the solder land can be greatly reduced, thereby increasing the integration density of semiconductor devices.

Seventh, the second recess can include a pair of blocks having major axes angled to deviate from the major axis of the first recess, and a straight line connecting the centers of the pair of blocks of the second recess can be angled to deviate from an extension line of the minor axis of the first recess. Thus, the size of the solder land may be further reduced so as to increase the integration density of semiconductor devices.

Eighth, when the second recess is arranged such that the straight line connecting the centers of the pair of blocks of the second recess is in the same direction as an external force, stress can be substantially dispersed.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Various operations will be described as multiple discrete steps performed in a manner that is most helpful in understanding the invention. However, the order in which the steps are described does not imply that the operations are order-dependent or that the order that steps are performed must be the order in which the steps are presented.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor device comprising:
   a semiconductor substrate;
   a bonding pad disposed on the semiconductor substrate;
   a passivation layer, a buffer layer, and an insulating layer sequentially stacked on the semiconductor substrate,
   wherein a first recess is defined within the passivation layer, the buffer layer, and the insulating layer to expose at least a region of the bonding pad,
   wherein a second recess is defined within the insulating layer to expose at least a region of the buffer layer and spaced apart from the first recess; and
   a conductive solder bump disposed within the first and second recesses, the conductive solder bump being connected to the bonding pad in the first recess and supported by the buffer layer through a protrusion of the conductive solder bump extending into the second recess.

2. The device of claim 1, further comprising a metal barrier layer formed of one selected from the group consisting of titanium (Ti), copper (Cu), and nickel (Ni) on the first recess and on a portion of the insulating layer configured to separate the second recess from the first recess,
   wherein the buffer layer is bonded to the protrusion in the second recess.

3. The device of claim 2, wherein the buffer layer directly contacts the protrusion in the second recess.

4. The device of claim 1, further comprising a metal barrier layer formed of one selected from the group consisting of titanium (Ti), copper (Cu), and nickel (Ni) on the first recess and the insulating layer,
   wherein the buffer layer is not bonded to the protrusion in the second recess.

5. The device of claim 4, wherein the metal barrier layer is disposed between the buffer layer and the protrusion.

6. The device of claim 1, wherein the sectional area of the first recess is about 20% to about 30% of the cross-sectional area of the solder bump.

7. The device of claim 1, wherein the buffer layer includes a photosensitive polyimide (PSPI) layer functioning as a photoresist pattern to reduce stress applied to the semiconductor device.

8. The device of claim 1, wherein the first recess has a block shape having a major axis and a minor axis that extends from the center thereof in perpendicular directions to each other in plan view,
   wherein the major axis is at least twice as long as the minor axis.

9. The device of claim 1, wherein the first recess has a block shape having a major axis and a minor axis that extends from the center thereof in perpendicular directions to each other in plan view,
   wherein the second recess is spaced apart from the first recess by a portion of the insulating layer and includes at least one block having a major axis angled to deviate from a major axis of the first recess.

10. The device of claim 9, wherein the second recess includes a pair of blocks, and a straight line connecting the centers of the pair of blocks of the second recess passes through the center of the first recess.

11. The device of claim 10, wherein the straight line connecting the centers of the pair of blocks of the second recess is angled to deviate from an extension line of the minor axis of the first recess.

12. The device of claim 11, wherein the straight line connecting the centers of the pair of blocks of the second recess is in the same direction as an external force applied to a side surface of the solder bump.

13. The device of claim 1, wherein a portion of the insulating layer is disposed between the first recess and the second recess.

14. A semiconductor device comprising:
   a semiconductor substrate;
   a bonding pad disposed on the semiconductor substrate;
   a passivation layer, a buffer layer, and an insulating layer sequentially stacked on the semiconductor substrate, wherein a first recess is disposed within the passivation layer, the buffer layer, and the insulating layer to expose at least a region of the bonding pad, wherein a second recess is disposed within the buffer layer and the insulating layer to expose a region of the passivation layer and spaced apart from the first recess; and a conductive solder bump disposed within the first and second recesses, the conductive solder bump being connected to the bonding pad in the first recess and supported by the passivation layer using a protrusion of the conductive solder bump extending into the second recess.

15. The device of claim 14, further comprising a metal barrier layer formed of one selected from the group consisting of titanium (Ti), copper (Cu), and nickel (Ni) on the first recess, the insulating layer configured to separate the second recess from the first recess and the second recess, wherein the passivation layer is bonded to the protrusion in the second recess.

16. The device of claim 14, further comprising a metal barrier layer formed of one selected from the group consisting of titanium (Ti), copper (Cu), and nickel (Ni) on the first recess and the insulating layer configured to separate the second recess from the first recess, wherein the passivation layer is not bonded to the protrusion in the second recess.

17. The device of claim 14, wherein portions of the buffer layer and the insulating layer are interposed the first recess and the second recess.

18. A semiconductor device comprising:

a semiconductor substrate;

a bonding pad disposed on the semiconductor substrate;

a passivation layer, a buffer layer, and an insulating layer sequentially stacked on the semiconductor substrate including the bonding pad, wherein a first recess is disposed within the passivation layer, the buffer layer, and the insulating layer to expose at least a region of the bonding pad;

wherein a second recess is disposed within the insulating layer to expose a region of the buffer layer adjacent the first recess, the first and second recesses collectively defining a single recess; and a conductive solder bump disposed within the first and second recesses, the conductive solder bump being connected to the bonding pad in the first recess and supported by the buffer layer through a protrusion of the conductive solder bump extending into the second recess.

19. The device of claim 18, wherein the first and second recesses present a stepped but contiguously extending surface uninterrupted by the insulating layer.

* * * * *